(12) United States Patent
Takekida et al.

(10) Patent No.: US 12,707,640 B2
(45) Date of Patent: Aug. 11, 2026

(54) SEMICONDUCTOR MEMORY DEVICE AND METHOD FOR MANUFACTURING SEMICONDUCTOR MEMORY DEVICE

(71) Applicant: Kioxia Corporation, Tokyo (JP)

(72) Inventors: Hideto Takekida, Nagoya Aichi (JP); Hisashi Harada, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 665 days.

(21) Appl. No.: 18/176,176

(22) Filed: Feb. 28, 2023

(65) Prior Publication Data

US 2023/0413567 A1 Dec. 21, 2023

(30) Foreign Application Priority Data

Jun. 21, 2022 (JP) ................................ 2022-099471

(51) Int. Cl.

| | |
|---|---|
| ***H10B 43/27*** | (2023.01) |
| ***H10B 41/10*** | (2023.01) |
| ***H10B 41/27*** | (2023.01) |
| ***H10B 41/35*** | (2023.01) |
| ***H10B 43/10*** | (2023.01) |
| ***H10B 43/35*** | (2023.01) |
| ***H10W 20/41*** | (2026.01) |

(52) U.S. Cl.

CPC ............. *H10B 43/35* (2023.02); *H10B 41/10* (2023.02); *H10B 41/27* (2023.02); *H10B 41/35* (2023.02); *H10B 43/10* (2023.02); *H10B 43/27* (2023.02); *H10W 20/435* (2026.01)

(58) Field of Classification Search

CPC ............................... H10B 43/27; H10B 43/20

See application file for complete search history.

(56) References Cited

U.S. PATENT DOCUMENTS

| | | | | |
|---|---|---|---|---|
| 2020/0395341 | A1 | 12/2020 | Maejima et al. | |
| 2022/0093633 | A1 | 3/2022 | Ishiduki | |
| 2022/0108947 | A1 | 4/2022 | Luo et al. | |
| 2023/0240071 | A1 * | 7/2023 | Tseng .................... | H10B 41/10 257/314 |

(Continued)

FOREIGN PATENT DOCUMENTS

| | | | |
|---|---|---|---|
| JP | 2022-051289 | A | 3/2022 |
| TW | 202133159 | A | 9/2021 |

*Primary Examiner* — Christopher A Johnson
(74) *Attorney, Agent, or Firm* — Foley & Lardner LLP

(57) ABSTRACT

A semiconductor memory device includes a stacked body, a first metal layer, and a first columnar body. The stacked body includes a plurality of gate electrode layers and a plurality of insulating layers. The plurality of gate electrode layers include a first gate electrode layer, and a second gate electrode layer having a length in a second direction intersecting a first direction that is shorter than that of the first gate electrode layer. The first metal layer is disposed at least on a first side with respect to a terrace portion of the first gate electrode layer. The first columnar body is disposed on the first side with respect to the terrace portion of the first gate electrode layer. The first columnar body includes a conductive portion extending in the first direction and penetrating the first metal layer to be connected to the terrace portion of the first gate electrode layer, and an insulator disposed at least between the first metal layer and the conductive portion.

16 Claims, 23 Drawing Sheets

(56) References Cited

U.S. PATENT DOCUMENTS

| | | | | |
|---|---|---|---|---|
| 2023/0276625 | A1* | 8/2023 | Watanabe .............. | H10B 41/35<br>257/314 |
| 2023/0413542 | A1* | 12/2023 | Xu ......................... | H10B 43/27 |

* cited by examiner 1
11
60
30B
30B
30A
20
SRb
AR
SRa
61
101
HR
31
(SGS)
31
(WL)
BL
40
59
GND
F4
31 (SGS)
86
84
83
80
81
F8
+Z
+Y
-X
-Z
+X 11
30
30B
30A
20
85
31 (SGD)
31 (WL)
32
31 (WL)
32
32 (32S)
82
31 (WL)
32
31 (WL)
32
31 (SGS)
24
23 (SL)
22
21
F7
ST
SHE
40
SHE BL
59
F5
57
58
H1
40A
40C
40B
+Z
-Z
-X
-Y
+Y

FIG. 6

11
SRa
101
101 (101A)
101 (101B)
101 (101C)
83
101 (101D)
94
101 (101E)
101 (101F)
GND
61
93
96
91
92
95
84
86
85
31 (SGD)
31 (WL, 31F)
31 (WL, 31E)
31 (WL, 31D)
32 (32S)
31 (WL, 31C)
31 (WL, 31B)
31 (WL, 31A)
31 (SGS)
20
30B
30A
30
80
81
82
T1
T2
72
71
75A
75B
+Z
−Z
+X
−X
+Y 9a-9a CROSS SECTION
101
112
111
81
91
ST
58
57
81
91
112 111 101
-Y
+X
+Z
-X
+Y
75 (75S)
101
93
81
92
82
31 (31B)
31
91
T2
T1
9a
9a
31 (31A)
+Z
+Y
-X
-Z
112 111 71

Figure 21:
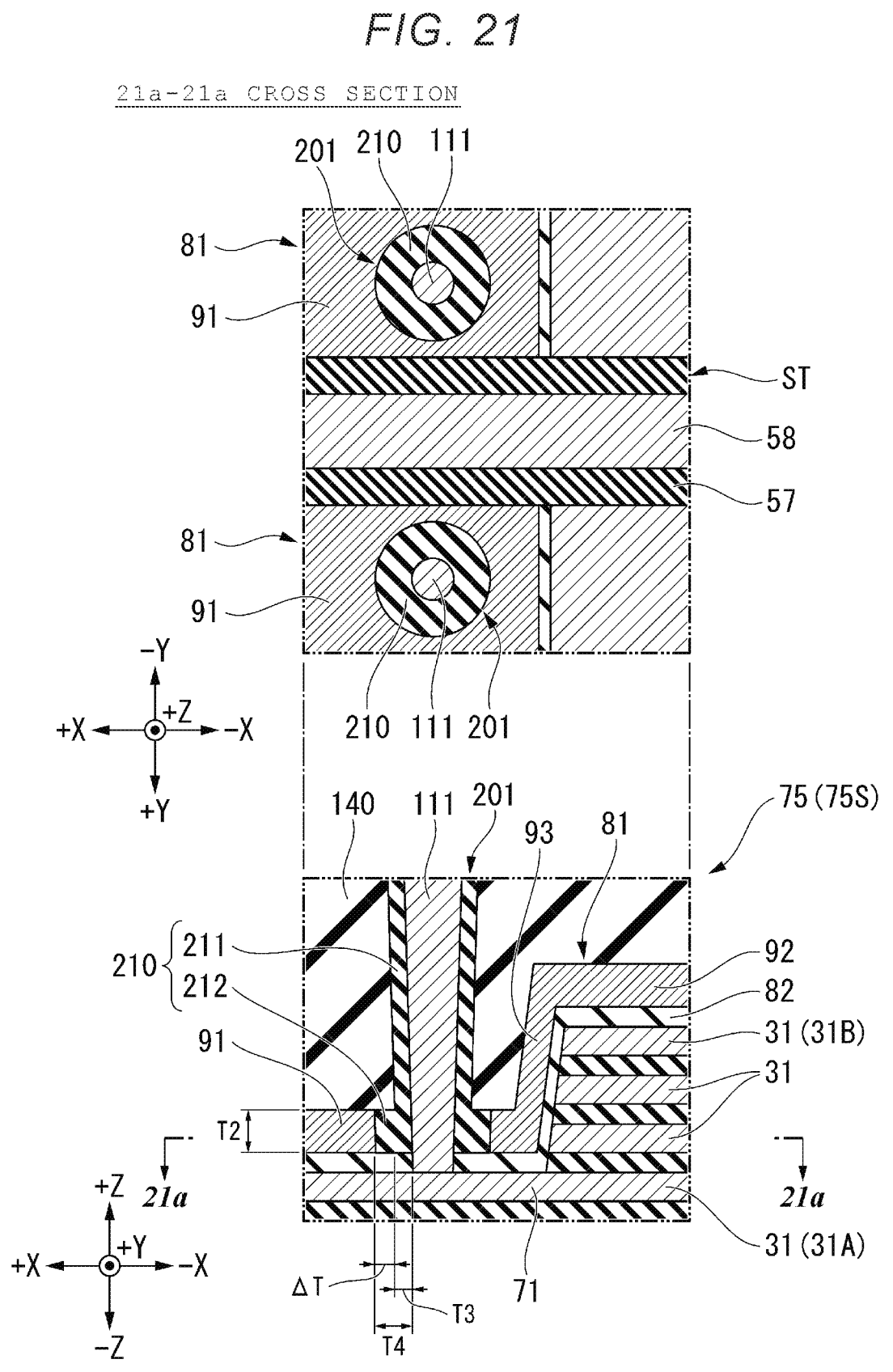

21a-21a CROSS SECTION 201 210 111
81
91
ST
58
57
81
91
−Y
+X +Z −X
+Y
210 111 201
140 111 201
93 81
75 (75S)
210 211
212
92
82
31 (31B)
91
31
T2
21a
21a
+Z
+X +Y −X
−Z
31 (31A)
ΔT
71
T3
T4

SEMICONDUCTOR MEMORY DEVICE AND METHOD FOR MANUFACTURING SEMICONDUCTOR MEMORY DEVICE

CROSS-REFERENCE TO RELATED APPLICATION

This application is based upon and claims the benefit of priority from Japanese Patent Application No. 2022-099471, filed Jun. 21, 2022, the entire contents of which are incorporated herein by reference.

FIELD

Embodiments described herein relate generally to a semiconductor memory device and a method for manufacturing the semiconductor memory device.

BACKGROUND

A semiconductor memory device is known including a stacked body in which a plurality of word lines and a plurality of insulating layers are alternately stacked one by one, a plurality of memory pillars penetrating the stacked body in a thickness direction of the stacked body, and a plurality of contacts. The stacked body has a stepped portion in which the plurality of word lines have different lengths. The plurality of contacts are connected to the plurality of word lines at the stepped portion of the stacked body.

DESCRIPTION OF THE DRAWINGS

FIG. 6 is a cross-sectional view taken along line F6-F6 of the memory cell array shown in FIG. 5.

FIG. 10 is a cross-sectional view illustrating a multistage stepped portion of the first embodiment.

Figure 11:
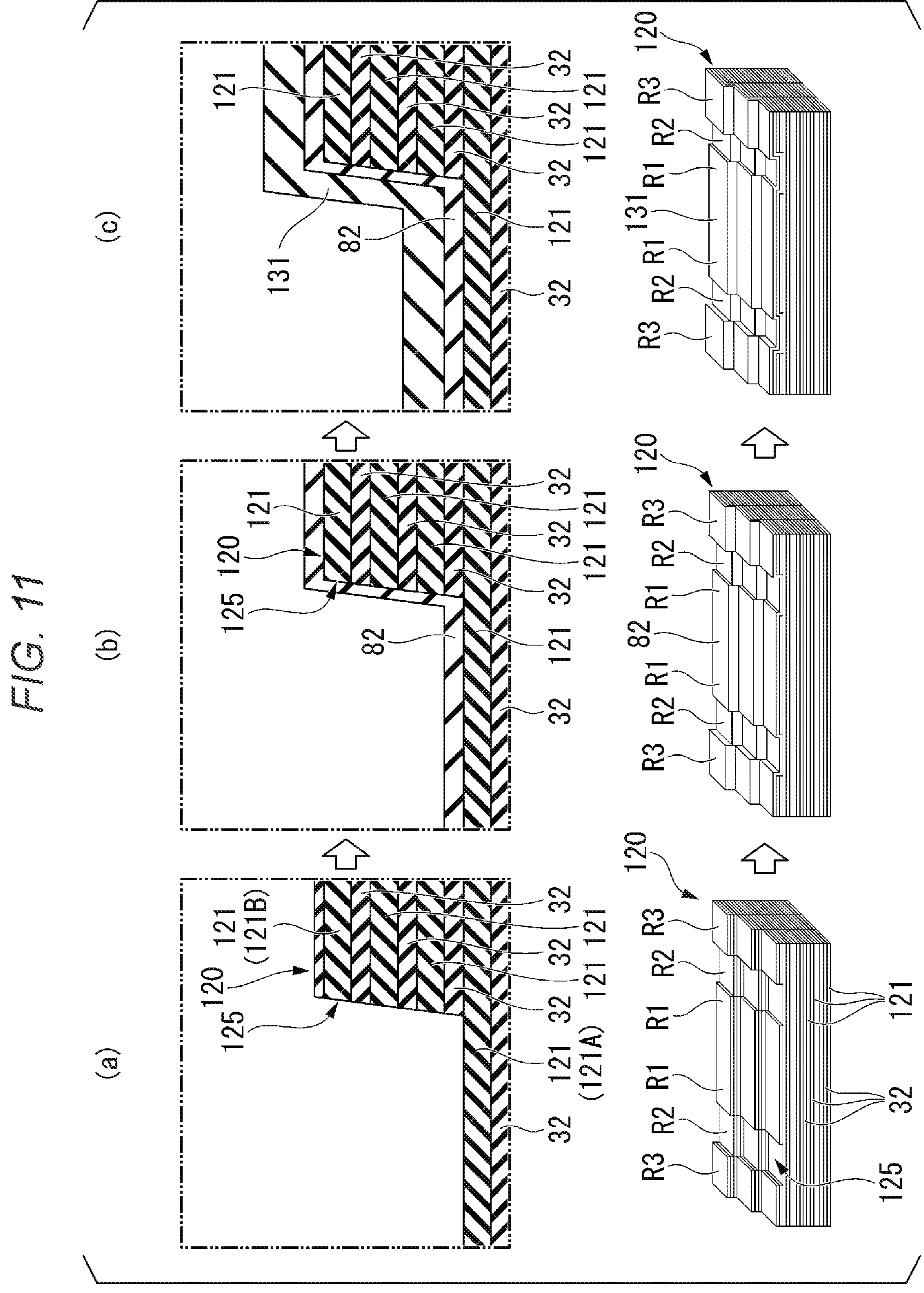

Parts (a) to (c) in FIG. 11 are cross-sectional views illustrating a method for manufacturing the semiconductor memory device according to the first embodiment.

Figure 12:
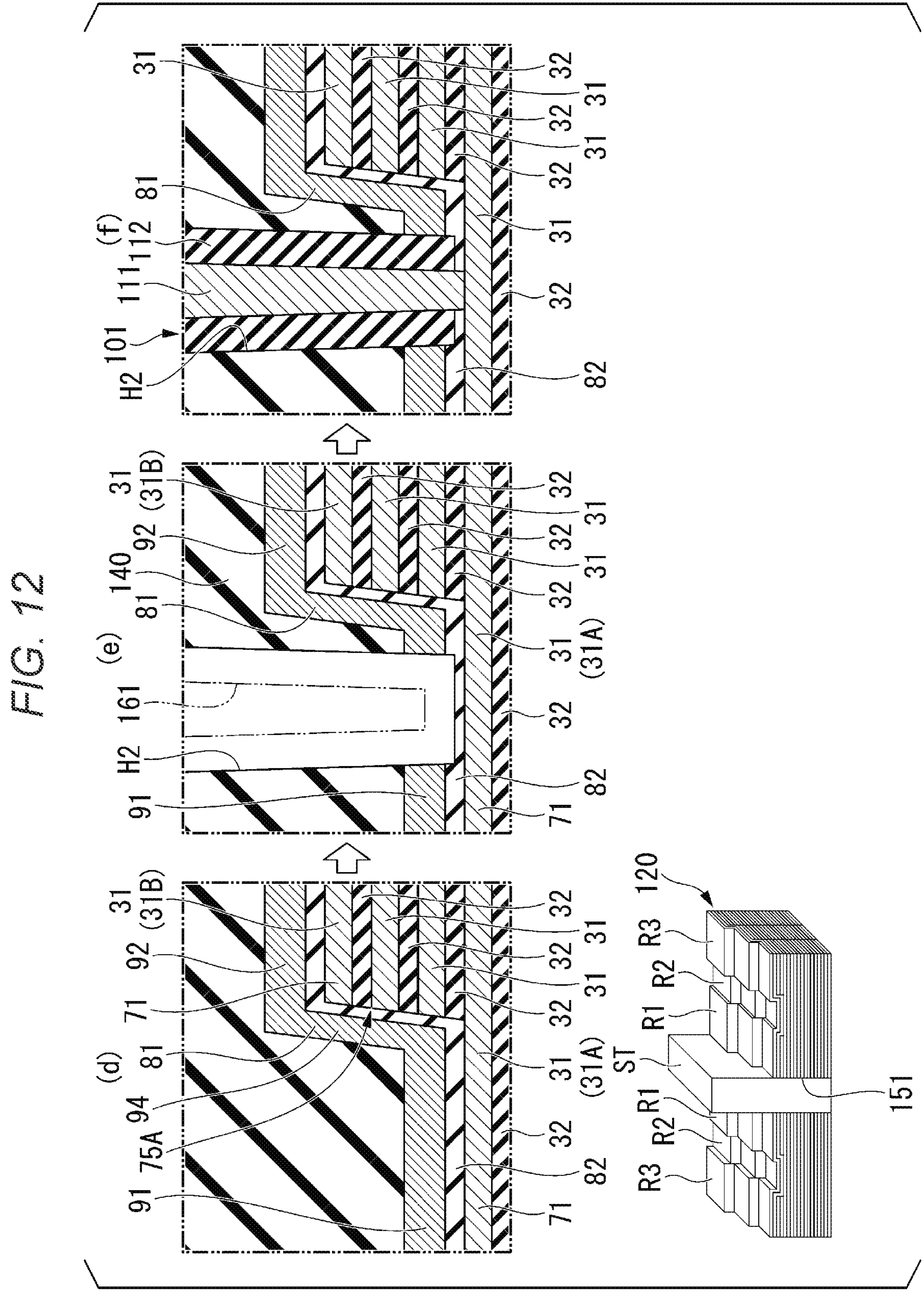

Parts (d) to (f) in FIG. 12 are cross-sectional views illustrating the method for manufacturing the semiconductor memory device according to the first embodiment.

Figure 13:
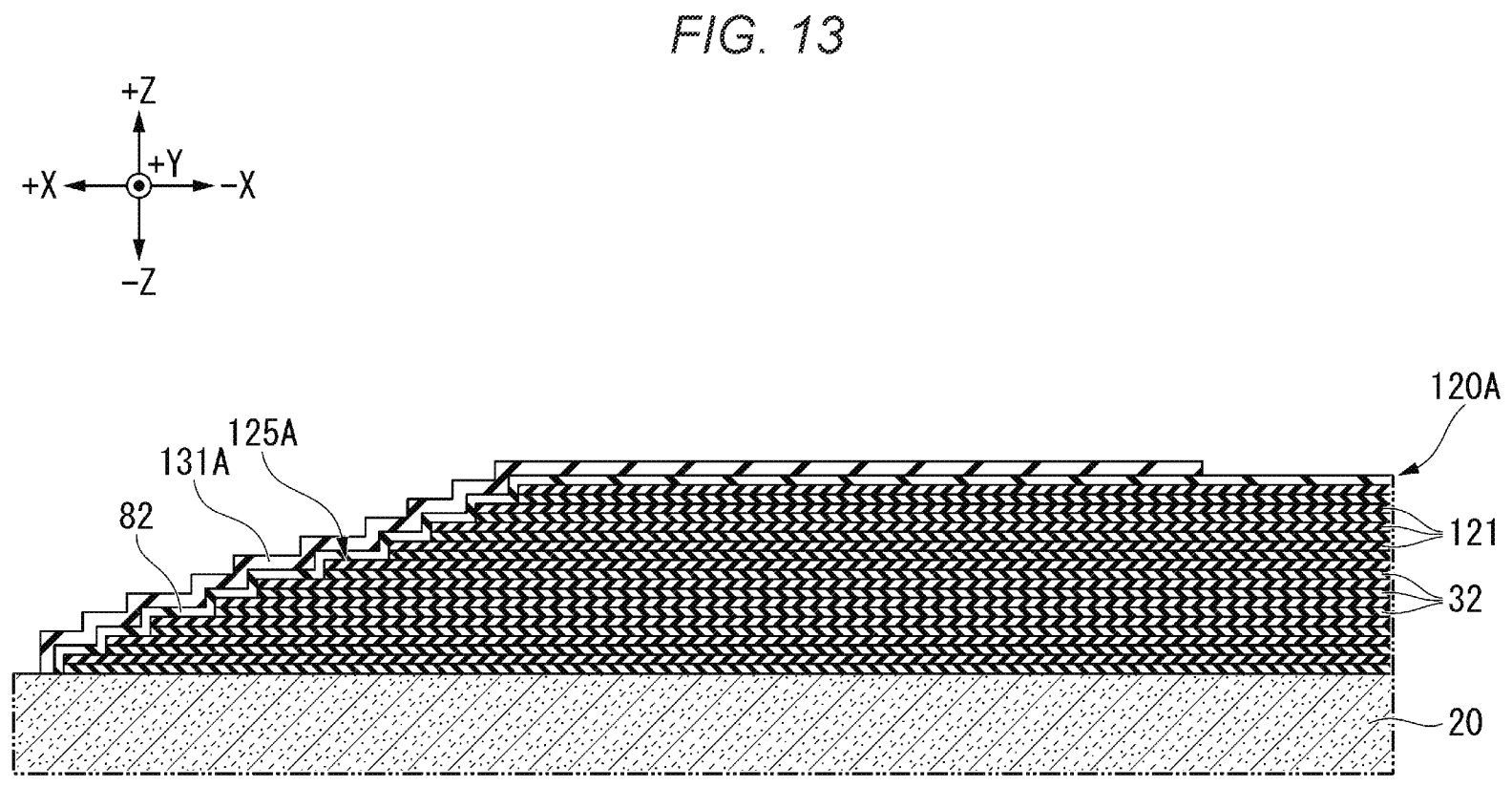

FIG. 13 is a cross-sectional view illustrating the method for manufacturing the semiconductor memory device according to the first embodiment.

Figure 14:
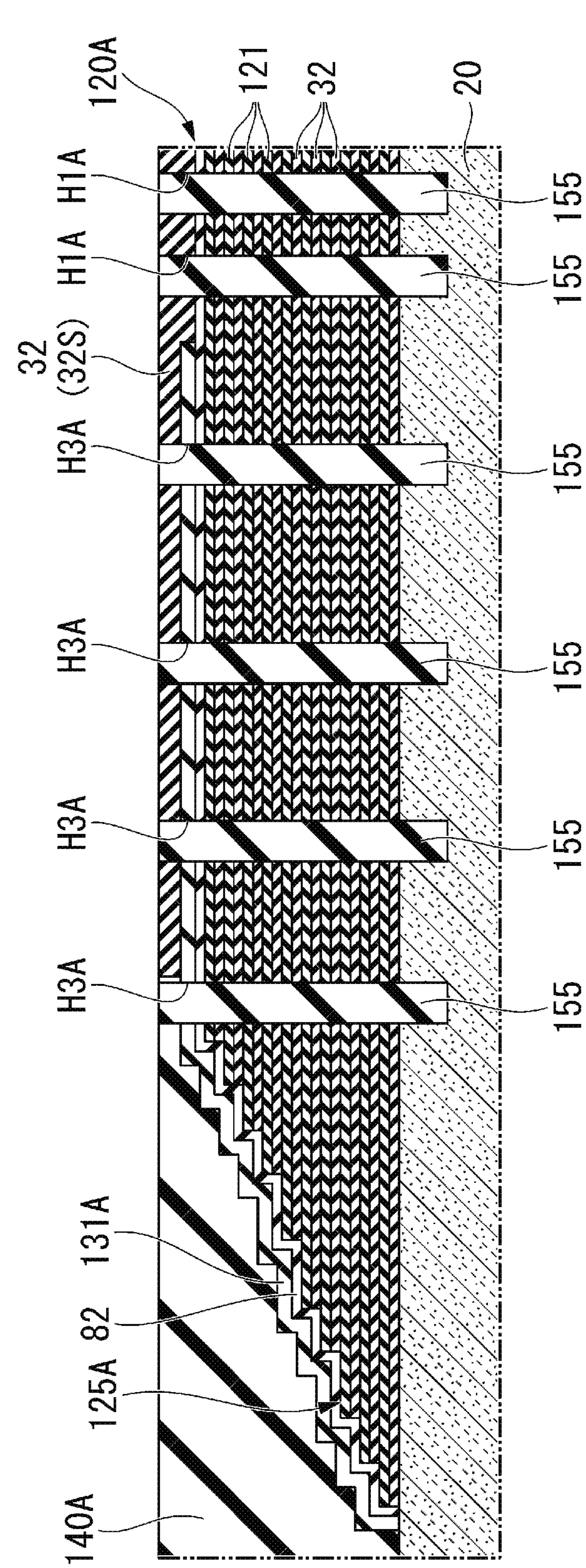

FIG. 14 is cross-sectional view illustrating the method for manufacturing the semiconductor memory device according to the first embodiment.

Figure 15:
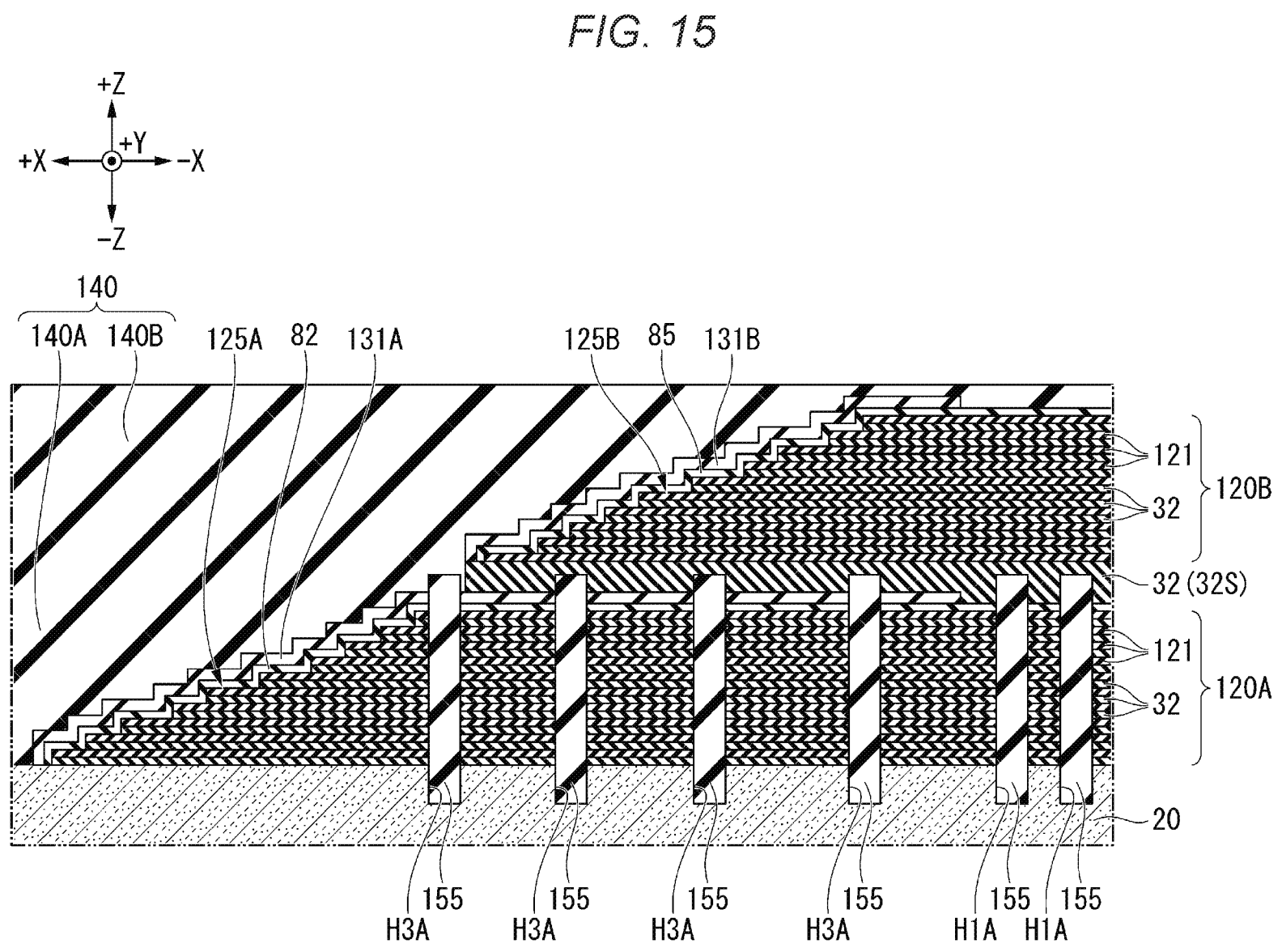
Figure 16:
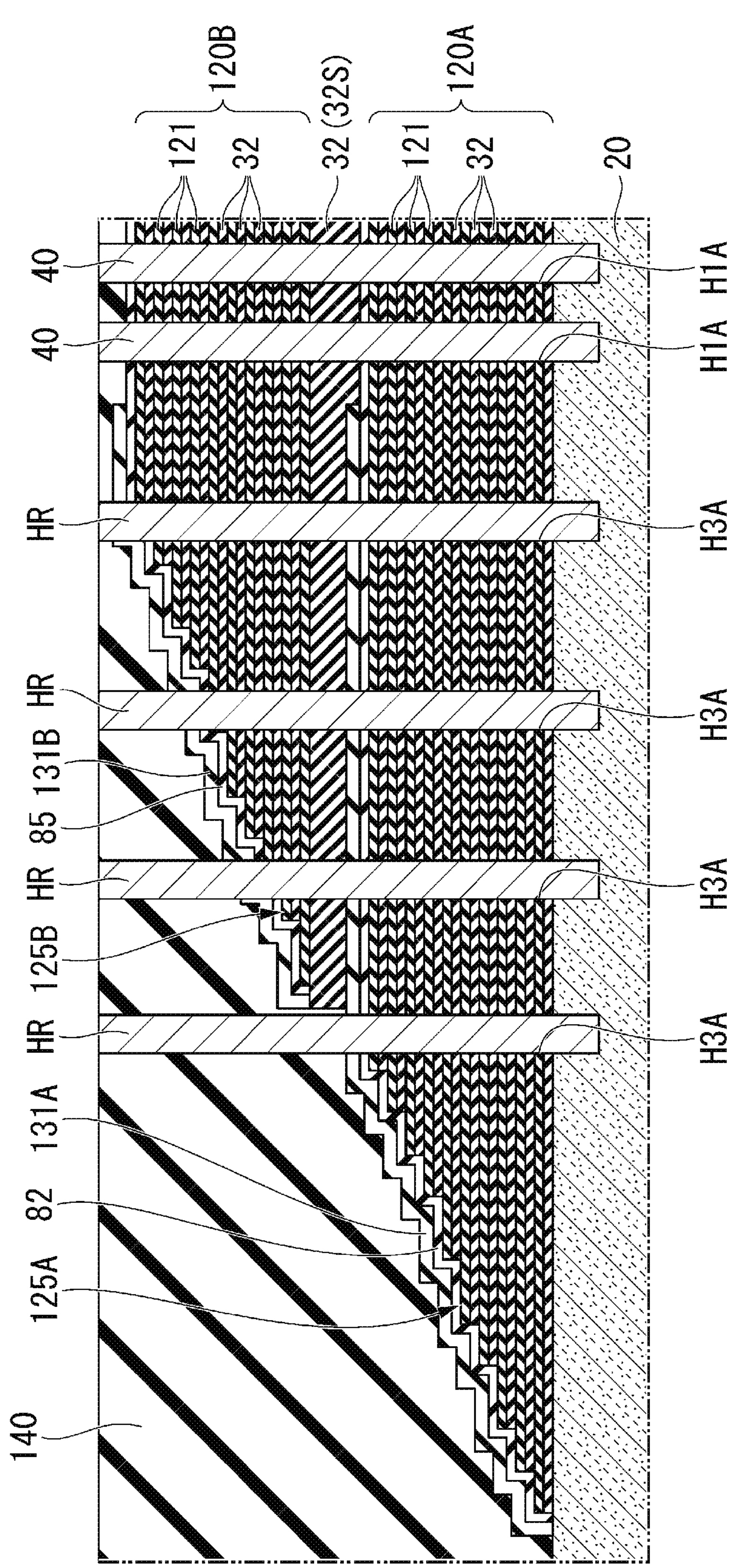

FIG. 15 is a cross-sectional view illustrating the method for manufacturing the semiconductor memory device according to the first embodiment;

FIG. 16 is a cross-sectional view illustrating the method for manufacturing the semiconductor memory device according to the first embodiment.

Figure 17:
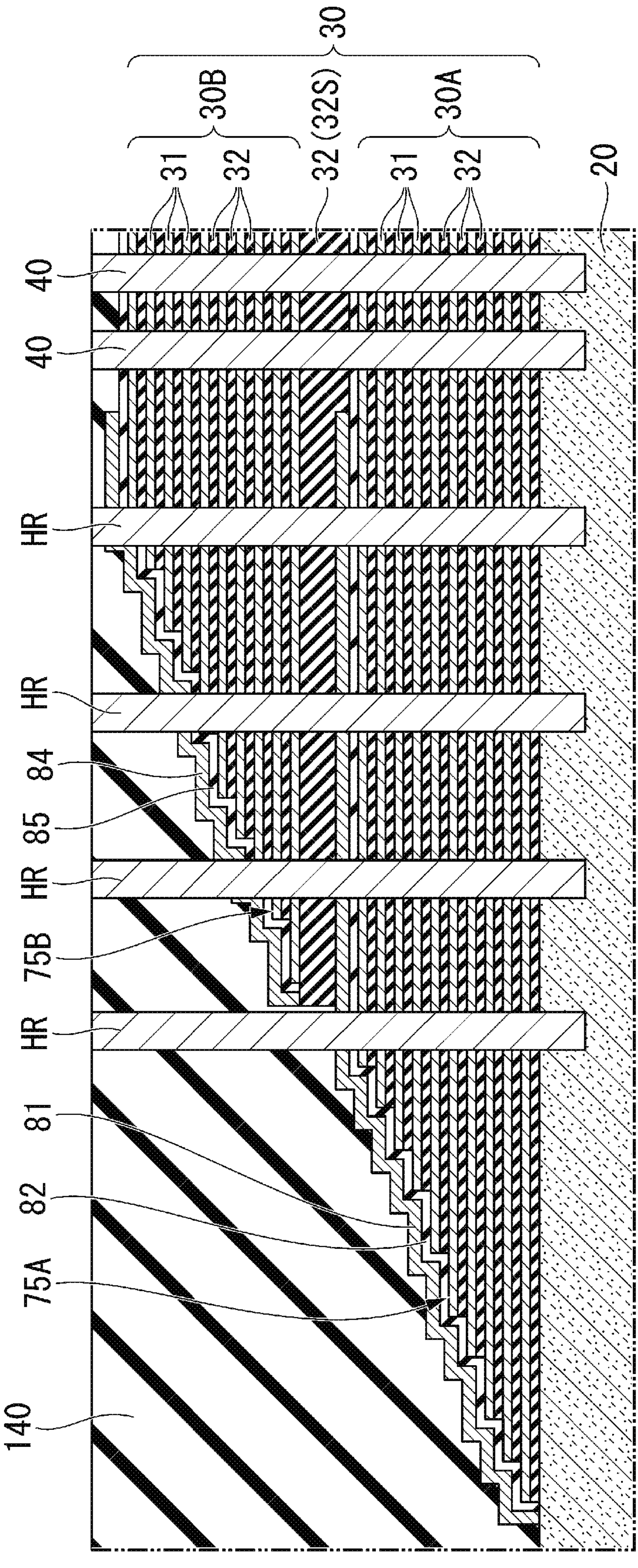

FIG. 17 is a cross-sectional view illustrating the method for manufacturing the semiconductor memory device according to the first embodiment.

Figure 18:
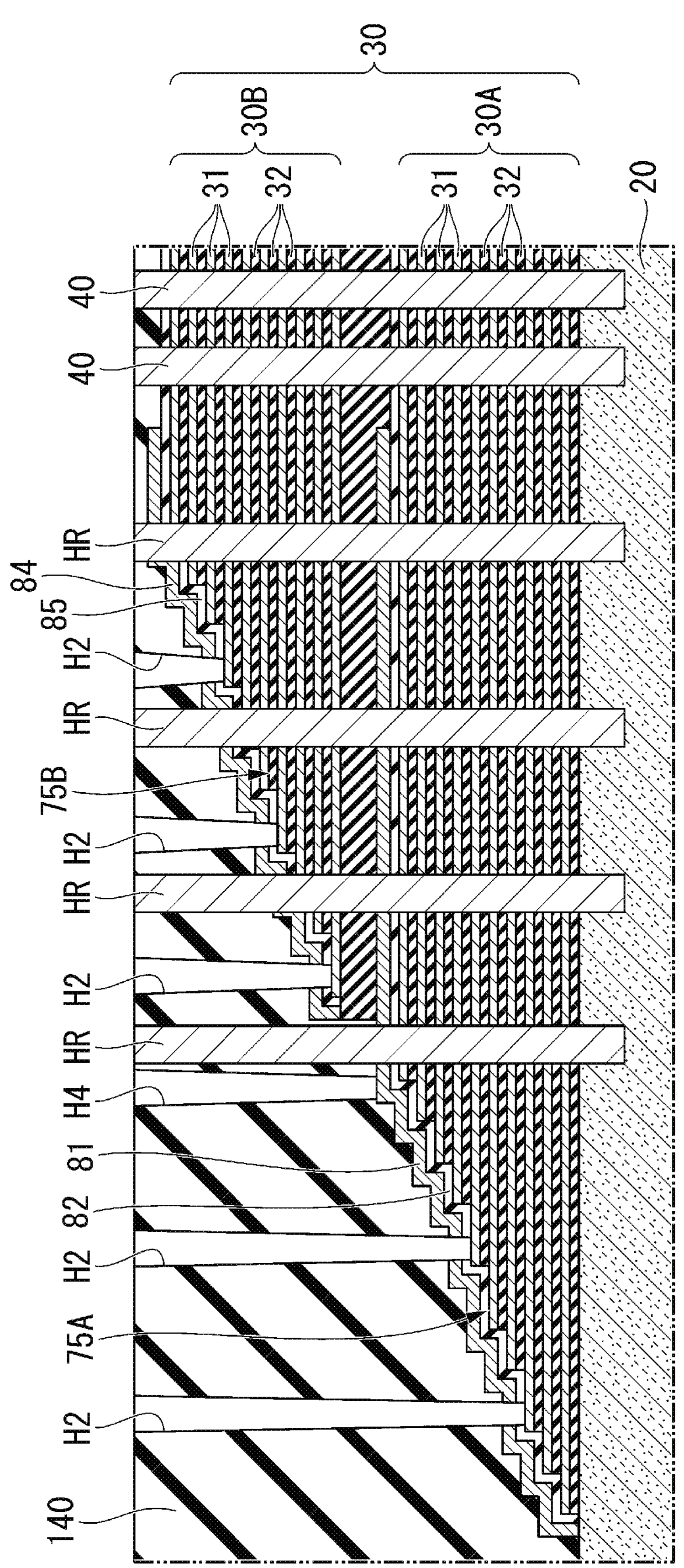

FIG. 18 is a cross-sectional view illustrating the method for manufacturing the semiconductor memory device according to the first embodiment.

Figure 19:
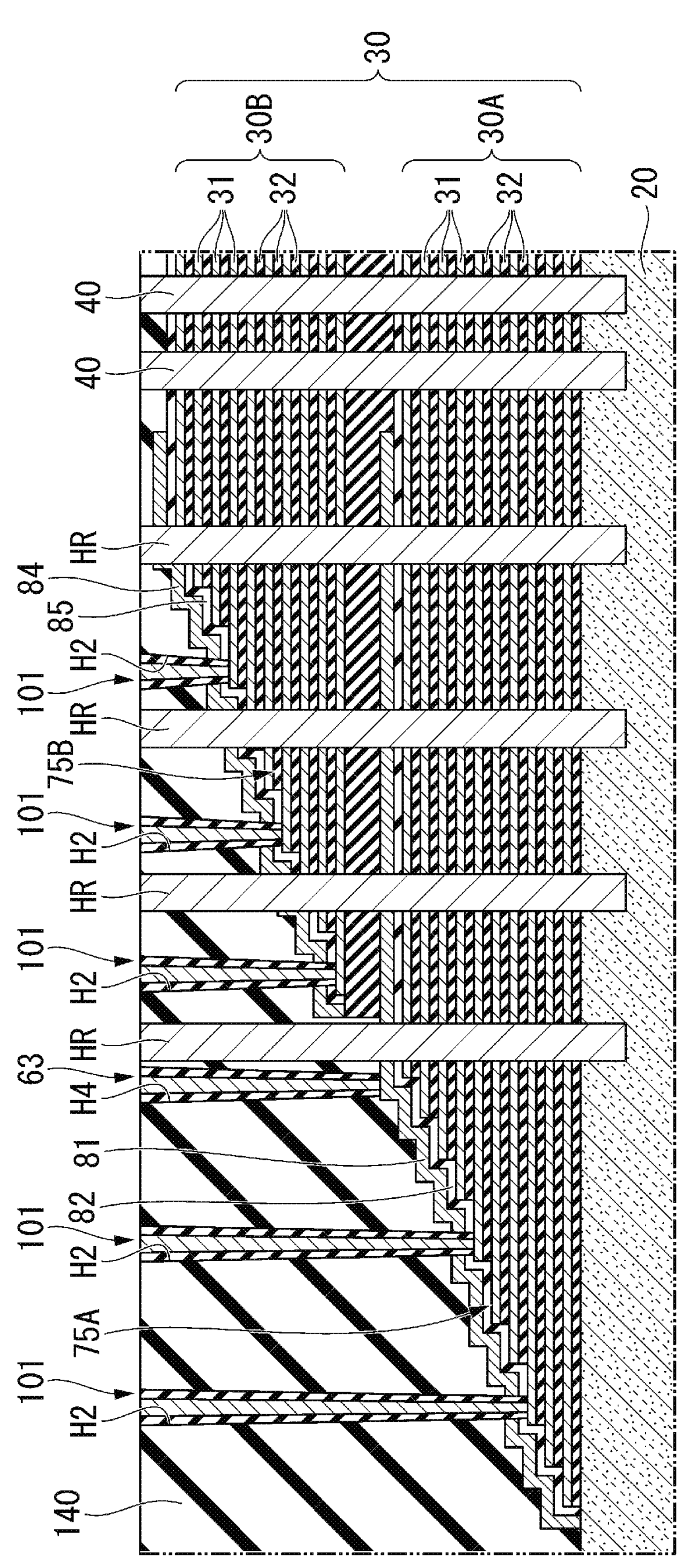

FIG. 19 is a cross-sectional view illustrating the method for manufacturing the semiconductor memory device according to the first embodiment.

Figure 20:
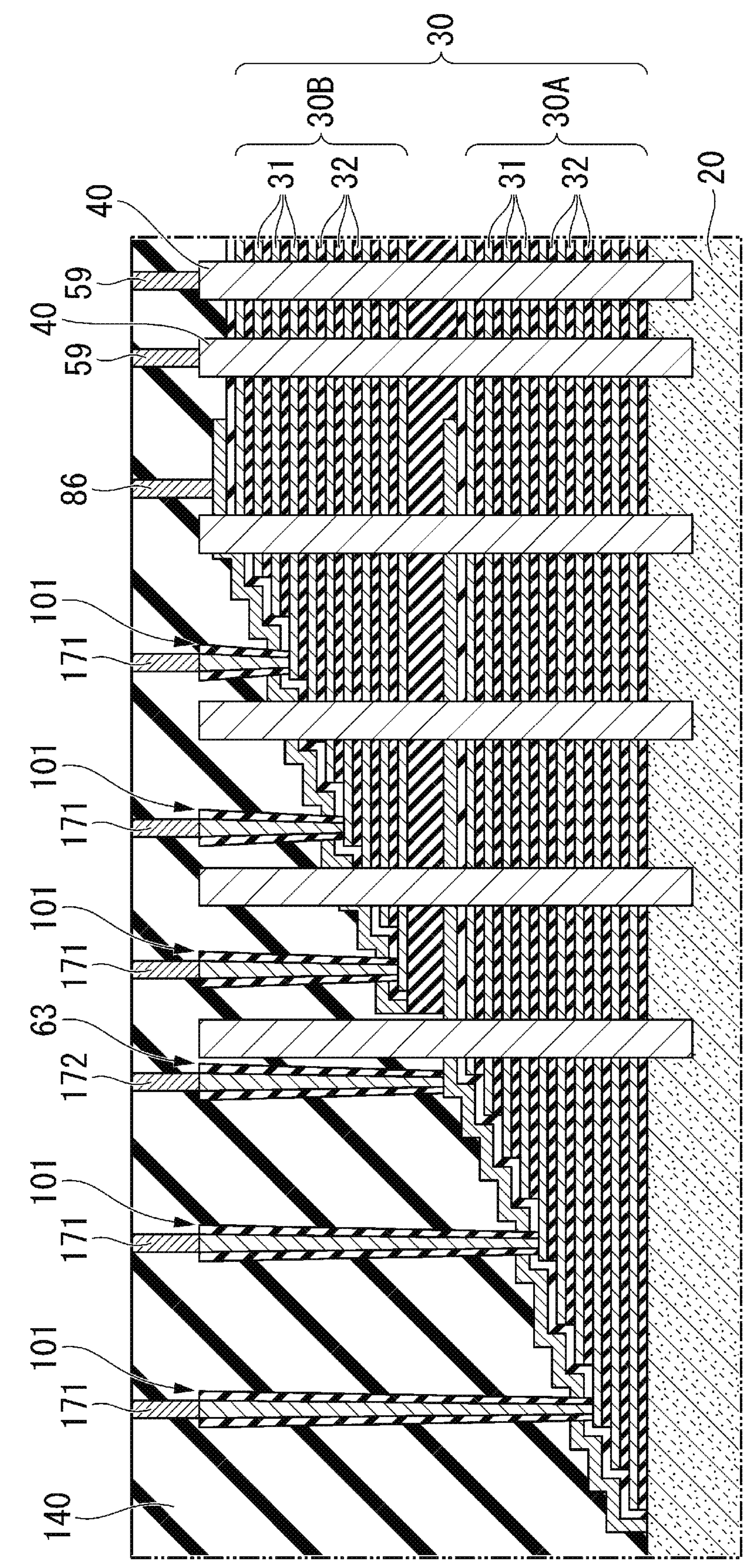

FIG. 20 is a cross-sectional view illustrating the method for manufacturing the semiconductor memory device according to the first embodiment.

FIG. 21 is a cross-sectional view illustrating a configuration of a contact of a second embodiment.

Figure 22:
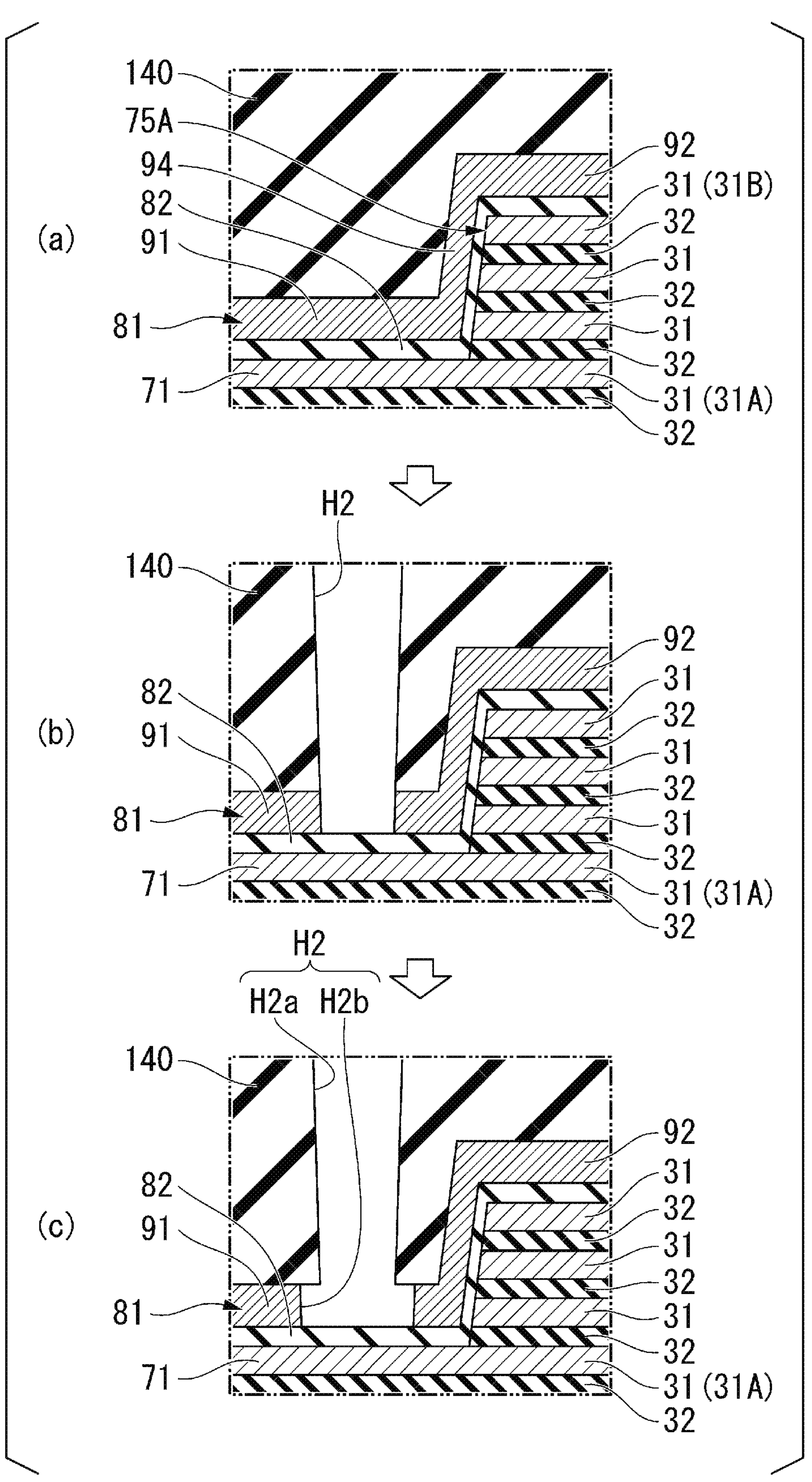

Parts (a) to (c) in FIG. 22 are cross-sectional views illustrating a method for manufacturing a semiconductor memory device according to the second embodiment.

Figure 23:
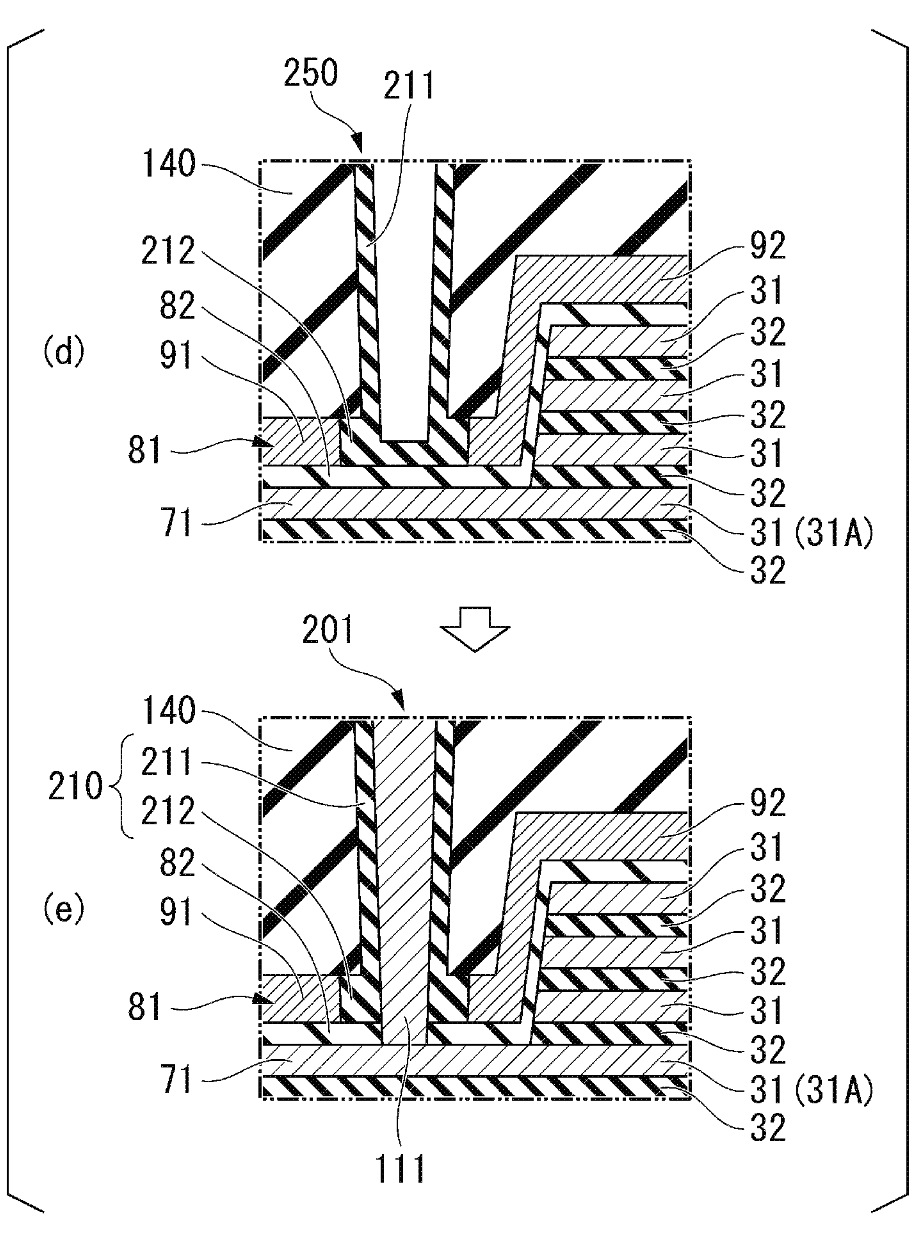

Parts (d) and (e) in FIG. 23 are cross-sectional views illustrating the method for manufacturing the semiconductor memory device according to the second embodiment.

DETAILED DESCRIPTION

Embodiments provide a semiconductor memory device and a method for manufacturing the semiconductor memory device that can improve manufacturability.

In general, according to at least one embodiment, the semiconductor memory device includes a stacked body, a first metal layer, and a first columnar body. The stacked body includes a plurality of gate electrode layers and a plurality of insulating layers. The plurality of gate electrode layers and the plurality of insulating layers are alternately stacked one by one in a first direction. The plurality of gate electrode layers includes a first gate electrode layer, and a second gate electrode layer disposed on a first side in the first direction with respect to the first gate electrode layer and having a length in a second direction intersecting the first direction that is shorter than that of the first gate electrode layer. The first gate electrode layer has a terrace portion that does not overlap with the second gate electrode layer in the first direction. The first metal layer is disposed at least on the first side with respect to the terrace portion of the first gate electrode layer. The first columnar body is disposed on the first side with respect to the terrace portion of the first gate electrode layer. The first columnar body includes a conductive portion extending in the first direction and penetrating the first metal layer to be connected to the terrace portion of the first gate electrode layer, and an insulating portion disposed at least between the first metal layer and the conductive portion.

The semiconductor memory device and the method for manufacturing the semiconductor memory device according to embodiments will be described below with reference to the drawings. In the following description, the same reference numerals are denoted to the configurations having the same or similar functions. Duplicate descriptions of these configurations may be omitted. In the following description, components having numerals or alphabetic characters for distinction at the end may omit the numerals or alphabetic characters at the end when the distinction is not necessary.

"Parallel", "perpendicular", or "same" may include "substantially parallel", "substantially perpendicular", or "substantially the same", respectively. "Connection" is not limited to mechanical connection and may include electrical connection. In other words, "connection" is not limited to the case where a plurality of elements are directly connected and may include the case where a plurality of elements are connected with another element interposed therebetween. The term "overlap" is not limited to the case where a plurality of elements are in contact with each other and may include the case where a plurality of elements overlap with another element interposed therebetween. The term "annular" is not limited to a circular shape and may include a rectangular annular shape and a triangular annular shape.

First, a +X direction, a −X direction, a +Y direction, a −Y direction, a +Z direction, and a −Z direction will be defined. The +X direction is a direction in which word lines WL, which will be described later, extend (see FIG. 3). The −X direction is the opposite direction to the +X direction. When the +X direction and the −X direction are not distinguished, the +X direction and the −X direction are simply referred to as an X direction. The +Y direction is a direction that intersects (for example, perpendicular to) the X direction. The +Y direction is a direction in which bit lines BL, which will be described later, extend (see FIG. 4). The −Y direction is the opposite direction to the +Y direction. When the +Y direction and the −Y direction are not distinguished, the +Y direction and the −Y direction are simply referred to as a Y direction. The +Z direction is a direction that intersects (for example, perpendicular to) the X and Y directions. The +Z direction is the direction from a stacked body 30, which will be described later, toward the bit line BL (see FIG. 3). The −Z direction is the opposite direction to the +Z direction. When the +Z direction and the −Z direction are not distinguished, the +Z direction and the −Z direction are simply referred to as a Z direction. In the following description, a +Z direction side may be referred to as "upper" and a −Z direction side may be referred to as "lower". However, these expressions are for convenience and do not define the direction of gravity. The X direction is an example of a "second direction". The Z direction is an example of a "first direction". The +Z direction side is an example of a "first side". In the drawings described below, illustrations of configurations unrelated to the description may be omitted. In the drawings described below, the number of some configurations (e.g., conductive layers) may be schematic.

First Embodiment

1. Configuration of Semiconductor Memory Device

Figure 1:
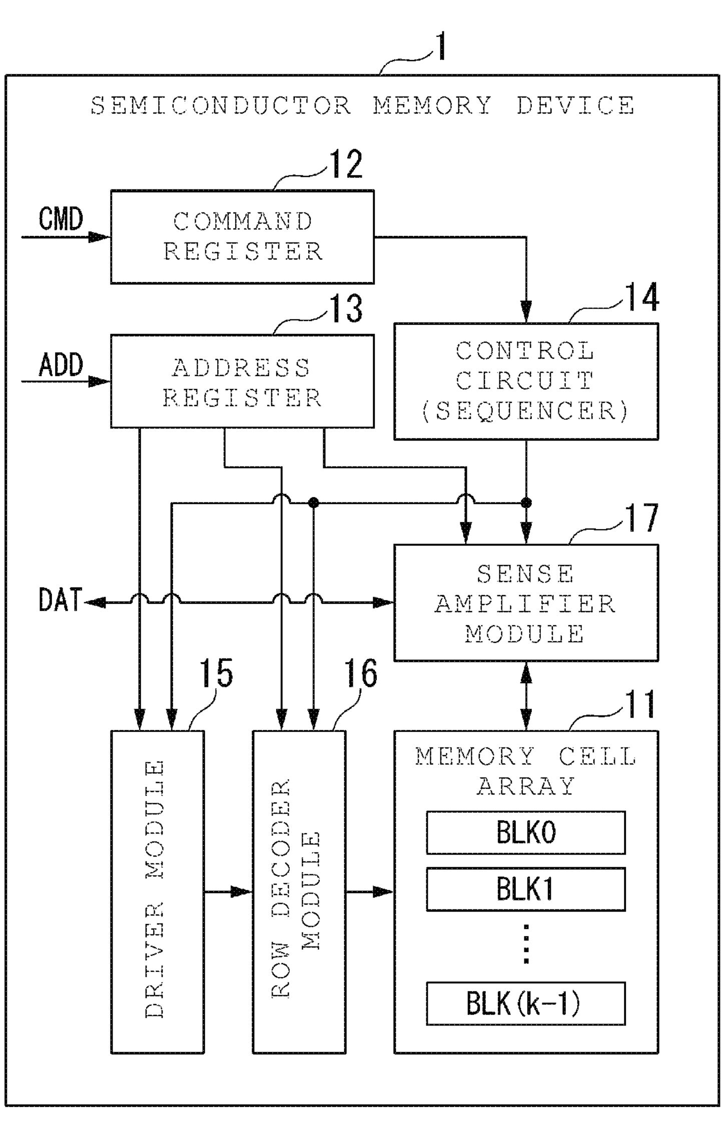
FIG. 1 is a block diagram showing a partial configuration of a semiconductor memory device according to a first embodiment.

FIG. 1 is a block diagram showing a partial configuration of a semiconductor memory device 1. The semiconductor memory device 1 is, for example, a non-volatile semiconductor memory device, such as a NAND flash memory. The semiconductor memory device 1 can be connected to, for example, an external host device and used as a storage space of the host device. The semiconductor memory device 1 includes, for example, a memory cell array 11, a command register 12, an address register 13, a control circuit (sequencer) 14, a driver module 15, a row decoder module 16, and a sense amplifier module 17.

The memory cell array 11 includes a plurality of blocks BLK0 to BLK(k−1) (k is an integer equal to or greater than 1). The block BLK is a set of a plurality of memory cell transistors. The block BLK is used as a data erase unit. The memory cell array 11 is provided with a plurality of bit lines and a plurality of word lines. Each memory cell transistor is associated with one bit line and one word line.

The command register 12 stores a command CMD that the semiconductor memory device 1 receives from the host device. The address register 13 stores address information ADD that the semiconductor memory device 1 receives from the host device. The address information ADD is used to select blocks BLK, word lines, and bit lines. The control circuit 14 controls various operations of the semiconductor memory device 1. For example, the control circuit 14 executes a data write operation, read operation, or erasing operation based on the command CMD stored in the command register 12.

The driver module 15 includes a voltage generation circuit and generates voltages used in various operations of the semiconductor memory device 1. The row decoder module 16 transfers the voltage applied to the signal line corresponding to the selected word line to the selected word line. The sense amplifier module 17 applies a desired voltage to each bit line in the write operation. In the read operation, the sense amplifier module 17 determines a data value stored in each memory cell transistor based on the voltage of each bit line, and transfers the determination result as read data DAT to the host device.

2. Configuration of Memory Cell Array

2.1 Electrical Configuration of Memory Cell Array

Figure 2:
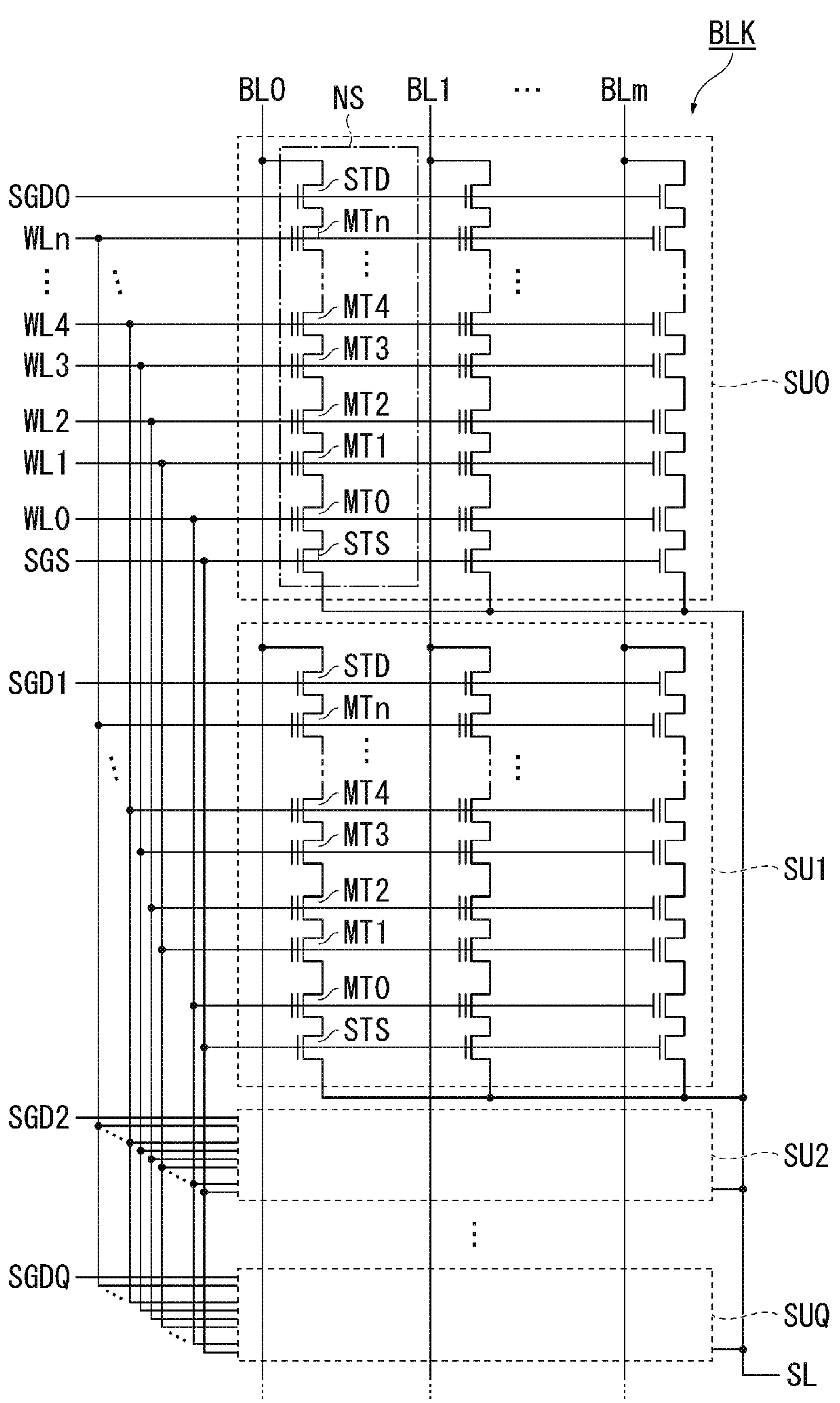
FIG. 2 is a diagram showing an equivalent circuit of a part of a memory cell array of the first embodiment.

FIG. 2 is a diagram showing an equivalent circuit of a part of the memory cell array 11. FIG. 2 shows one block BLK in the memory cell array 11. The block BLK includes a plurality of string units SU0 to SUQ (Q is an integer equal to or greater than 1).

Each string unit SU includes a plurality of NAND strings NS respectively associated with bit lines BL0 to BLm (m is an integer equal to or greater than 1). Each NAND string NS includes, for example, a plurality of memory cell transistors MT0 to MTn (n is an integer equal to or greater than 1), one or more drain-side select transistors STD, and one or more source-side select transistors STS.

In each NAND string NS, memory cell transistors MT0 to MTn are connected in series. Each memory cell transistor MT includes a control gate and a charge storage portion. The control gate of the memory cell transistor MT is connected to one of the word lines WL0 to WLn. In each memory cell transistor MT, charges are accumulated in the charge accumulation portion according to a voltage applied to the control gate via the word line WL, and the data value is stored in a non-volatile manner.

The drain of the drain-side select transistor STD is connected to the bit line BL corresponding to the NAND string NS. The source of the drain-side select transistor STD is connected to one end of the memory cell transistors MT0 to MTn connected in series. A control gate of the drain-side select transistor STD is connected to one of drain-side select gate lines SGD0 to SGDQ. The drain-side select transistor STD is electrically connected to the row decoder module 16 via the drain-side select gate line SGD. The drain-side select transistor STD connects the NAND string NS and the bit line BL when a predetermined voltage is applied to the corresponding drain-side select gate line SGD.

The drain of the source-side select transistor STS is connected to the other end of the memory cell transistors MT0 to MTn connected in series. The source of the source-side select transistor STS is connected to a source line SL. A control gate of the source-side select transistor STS is connected to a source-side select gate line SGS. The source-side select transistor STS connects the NAND string NS and the source line SL when a predetermined voltage is applied to the source-side select gate line SGS.

In the same block BLK, the control gates of the memory cell transistors MT0 to MTn are commonly connected to the corresponding word lines WL0 to WLn, respectively. In the same string unit SU, the control gates of the drain-side select transistors STD are commonly connected to the corresponding drain-side select gate lines SGD0 to SGDQ. The control gates of the source-side select transistors STS are commonly connected to the source-side select gate line SGS. In the memory cell array 11, the bit line BL is shared by NAND strings NS to which the same column address is assigned in the plurality of string units SU.

2.2 Physical Configuration of Memory Cell Array

Figure 3:
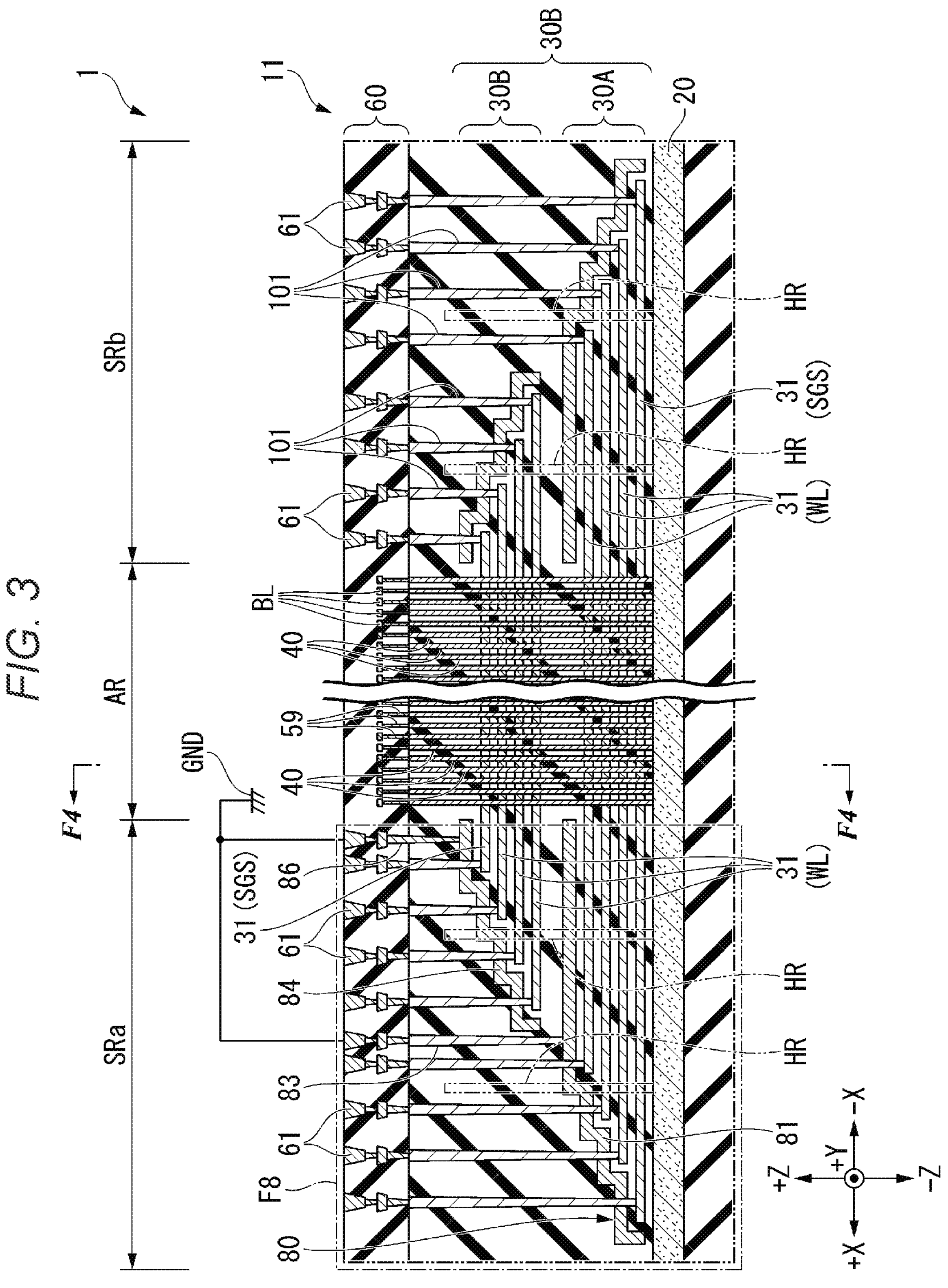
FIG. 3 is a cross-sectional view showing a part of the memory cell array of the first embodiment.

FIG. 3 is a cross-sectional view showing a part of the memory cell array 11. The memory cell array 11 includes, for example, a lower structure body 20, the stacked body 30, a plurality of memory pillars 40, a plurality of dividing portions ST (see FIG. 4), a plurality of upper dividing portions SHE (see FIG. 4), a plurality of contacts 59 for memory pillars, an upper wiring structure 60, a support HR, a stopper structure 80, and a plurality of contacts 101 for the conductive layer.

2.2.1 Lower Structure Body

First, the lower structure body 20 will be described. The lower structure body 20 is disposed on the −Z direction side with respect to the stacked body 30.

Figure 4:
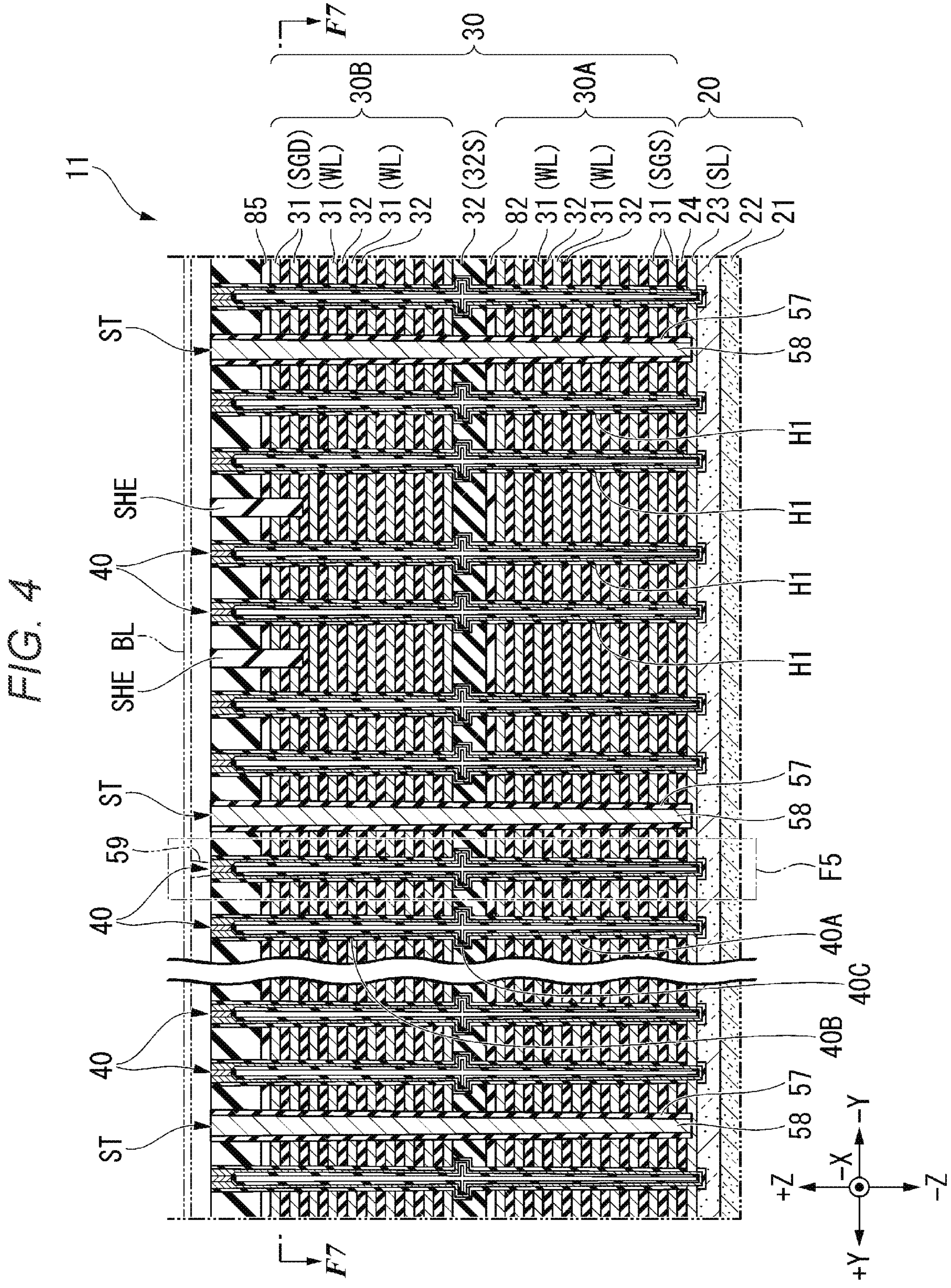
FIG. 4 is a cross-sectional view taken along line F4-F4 of the memory cell array shown in FIG. 3.

FIG. 4 is a cross-sectional view taken along line F4-F4 of the memory cell array 11 shown in FIG. 3. The lower structure body 20 includes, for example, a semiconductor substrate 21, a semiconductor layer 22, a conductive layer 23, and an insulating layer 24.

The semiconductor substrate 21 is the base substrate of the memory cell array 11. At least a part of the semiconductor substrate 21 is plate-shaped along the X and Y directions. The semiconductor substrate 21 is made of a semiconductor material containing silicon.

The semiconductor layer 22 is provided on the semiconductor substrate 21. The semiconductor layer 22 is layered along the X and Y directions. The semiconductor layer 22 is a stopper layer that prevents the deep excavation of a hole H1 in which the memory pillar 40 is formed in a manufacturing process of the semiconductor memory device 1. The semiconductor layer 22 is made of a semiconductor material such as polysilicon. The semiconductor memory device 1 may include an insulating layer functioning as a stopper layer instead of the semiconductor layer 22.

The conductive layer 23 is provided on the semiconductor layer 22. The conductive layer 23 is layered along the X and Y directions. The conductive layer 23 functions as the source line SL. The conductive layer 23 is made of a conductive material such as tungsten. A lower end portion of each memory pillar 40 is connected to the conductive layer 23.

The insulating layer 24 is provided on the conductive layer 23. The insulating layer 24 is layered along the X and Y directions. The insulating layer 24 is made of an insulating material such as silicon oxide.

2.2.2 Stacked Body

Next, the stacked body 30 will be described. The stacked body 30 is provided on the insulating layer 24. The stacked body 30 includes, for example, a plurality of conductive layers 31 and a plurality of insulating layers 32. The plurality of conductive layers 31 and the plurality of insulating layers 32 are alternately stacked one by one in the Z direction.

The conductive layer 31 is formed in layers along the X and Y directions. Each conductive layer 31 is made of a conductive material such as tungsten. The conductive layer 31 is an example of a “gate electrode layer”.

Among the plurality of conductive layers 31, one or more (for example, a plurality of) conductive layers 31 farthest from the semiconductor substrate 21 function as the drain-side select gate line SGD. The drain-side select gate line SGD is provided in common for the plurality of memory pillars 40 located in the X direction or the Y direction. The intersection portion between the drain-side select gate line SGD and a channel layer 42 (described later) of each memory pillar 40 functions as the above-described drain-side select transistor STD.

Among the plurality of conductive layers 31, one or more (for example, a plurality of) conductive layers 31 closest to the semiconductor substrate 21 function as the source-side select gate line SGS. The source-side select gate line SGS is provided in common for the plurality of memory pillars 40 located in the X direction or the Y direction. The intersection portion between the source-side select gate line SGS and the channel layer 42 of each memory pillar 40 functions as the above-described source-side select transistor STS.

Among the plurality of conductive layers 31, the remaining conductive layers 31 interposed between the conductive layers 31 functioning as the drain-side select gate line SGD or the source-side select gate line SGS function as the word line WL. The word line WL is provided in common for the plurality of memory pillars 40 located in the X and Y directions. In the present embodiment, the intersection portion between the word line WL and the channel layer 42 of each memory pillar 40 functions as the memory cell transistor MT. The memory cell transistor MT will be described later in detail.

The insulating layer 32 is an interlayer insulating film provided between two conductive layers 31 adjacent in the Z direction and insulating the two conductive layers 31 from each other. The insulating layer 32 is formed in layers along the X and Y directions. The insulating layer 32 is made of an insulating material such as silicon oxide.

In the present embodiment, the stacked body 30 includes a lower stacked body 30A and an upper stacked body 30B. The lower stacked body 30A is provided on the insulating layer 24. The lower stacked body 30A includes at least two conductive layers 31 in the plurality of conductive layers 31 described above and at least two insulating layers 32 in the plurality of insulating layers 32 described above. The upper stacked body 30B is disposed above the lower stacked body 30A. The upper stacked body 30B includes at least other two conductive layers 31 in the plurality of conductive layers 31 described above and at least other two insulating layers 32 in the plurality of insulating layers 32 described above. The plurality of insulating layers 32 described above include an insulating layer 32S disposed between the lower stacked body 30A and the upper stacked body 30B. The insulating layer 32S is thicker than other insulating layers 32 in the plurality of insulating layers 32, for example. The lower stacked body 30A is an example of a “first stacked body”. The upper stacked body 30B is an example of a “second stacked body”.

The stacked body 30 described above includes, for example, an array region AR and a pair of stepped regions SRa and SRb (see FIG. 3). The array region AR is a region in which the plurality of memory pillars 40 are provided and data can be stored. Each of the stepped regions SRa and SRb is a region where the plurality of conductive layers 31 (for example, the plurality of word lines WL) have different lengths in the X direction, and the plurality of contacts 101 for the conductive layer are provided. The stepped regions SRa and SRb are disposed separately on opposite sides in the array region AR in the X direction. Here, the configuration related to the array region AR is described, and a configuration related to the stepped regions SRa and SRb will be described later.

2.2.3 Memory Pillar

First, the memory pillar 40 will be described. The plurality of memory pillars 40 are provided in the array region AR. The plurality of memory pillars 40 are located side by side in the X and Y directions. Each memory pillar 40 extends in the Z direction and penetrates the stacked body 30, the insulating layer 24, and the conductive layer 23 (see FIG. 4). The lower end portions of the memory pillars 40 are recessed into the semiconductor layer 22. Each memory pillar 40 has a cylindrical shape or an inverted truncated cone shape along the Z direction.

In the present embodiment, each memory pillar 40 is a two-stage pillar and includes a lower pillar 40A, an upper pillar 40B, and a connection portion 40C. The lower pillar 40A is provided at the lower stacked body 30A and has, for example, an inverted truncated cone shape. The upper pillar 40B is provided at the upper stacked body 30B and has, for example, an inverted truncated cone shape. The connection portion 40C is provided between the lower pillar 40A and the upper pillar 40B, and connects the lower pillar 40A and the upper pillar 40B. The connection portion 40C is provided, for example, in the insulating layer 32S, and has widths in the X direction and the Y direction that are larger than those of the lower end of the upper pillar 40B.

Figure 5:
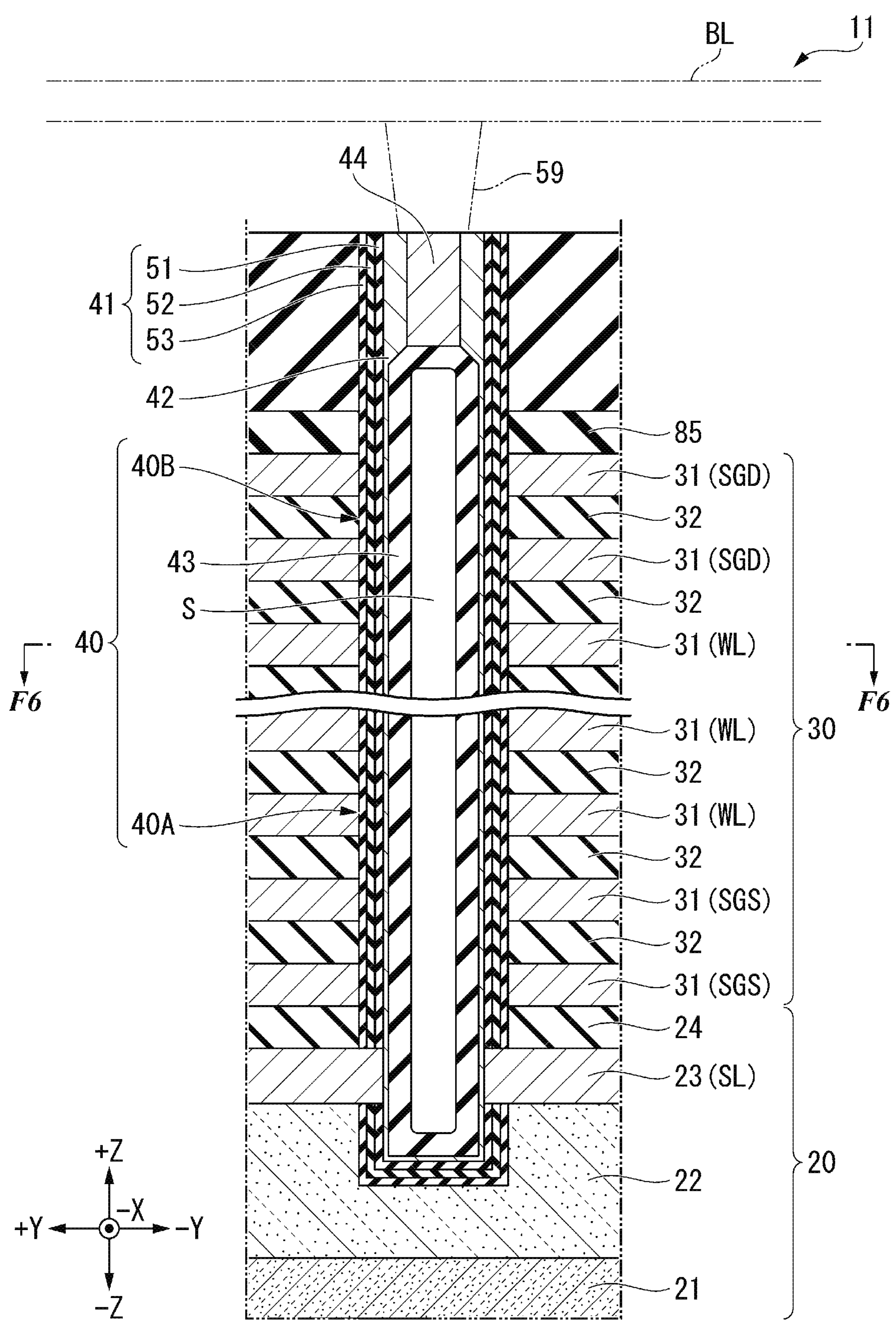
FIG. 5 is a cross-sectional view showing a region surrounded by line F5 of the memory cell array shown in FIG. 4.

FIG. 5 is a cross-sectional view showing a region surrounded by line F5 of the memory cell array 11 shown in FIG. 4. The memory pillar 40 includes, for example, a multilayer film 41, the channel layer 42, an insulating core 43, and a cap portion 44.

Multilayer Film

Figure 6:
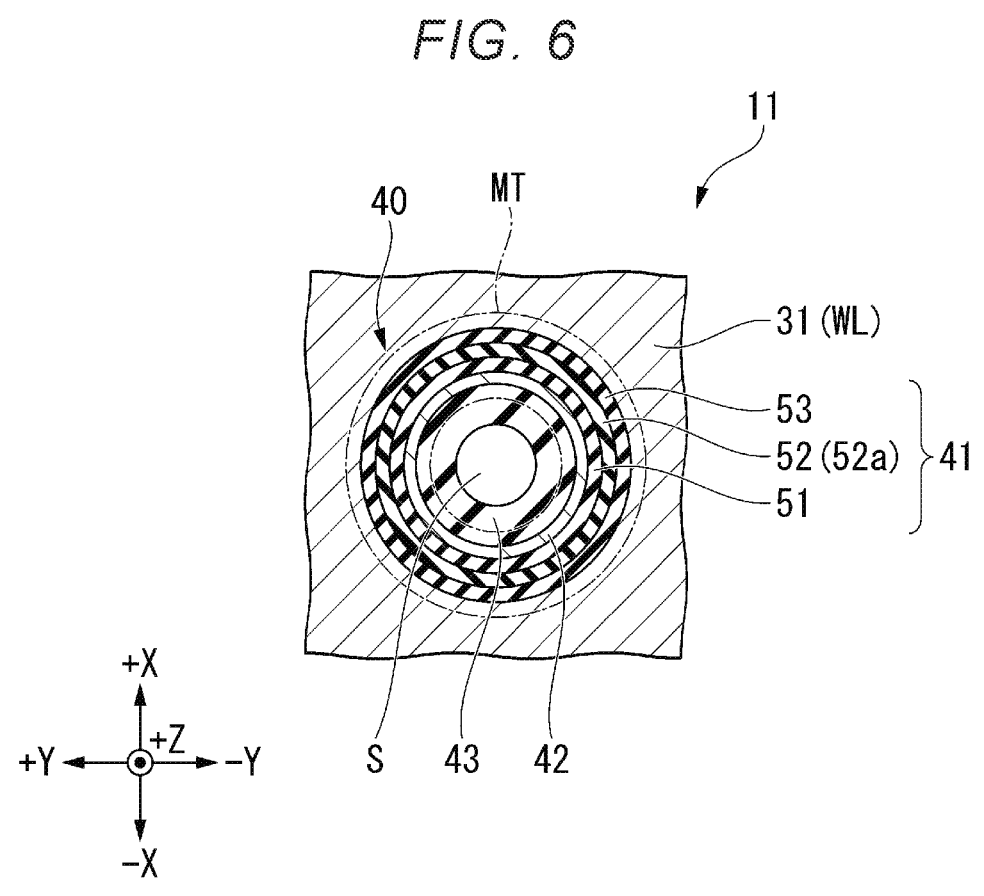

FIG. 6 is a cross-sectional view taken along line F6-F6 of the memory cell array 11 shown in FIG. 5.

The multilayer film 41 is provided on the outer peripheral side of the channel layer 42. The multilayer film 41 is positioned between the plurality of conductive layers 31 and the channel layer 42. The multilayer film 41 is an example of a "memory film". The multilayer film 41 includes, for example, a tunnel insulating film 51, a charge trap film 52, and a block insulating film 53.

The tunnel insulating film 51 is positioned between the channel layer 42 and the charge trap film 52. The tunnel insulating film 51 is formed, for example, in an annular shape along the outer peripheral surface of the channel layer 42 and extends in the Z direction along the channel layer 42. The tunnel insulating film 51 is a potential barrier between the channel layer 42 and the charge trap film 52. The tunnel insulating film 51 contains silicon oxides, or silicon oxide and silicon nitride.

The charge trap film 52 is provided on the outer peripheral side of the tunnel insulating film 51. The charge trap film 52 is positioned between the tunnel insulating film 51 and the block insulating film 53. The charge trap film 52 is formed, for example, in an annular shape along the outer peripheral surface of the tunnel insulating film 51 and extends in the Z direction along the tunnel insulating film 51. The charge trap film 52 is a functional film that has many crystal defects (trapping levels) and can trap charges in these crystal defects. The charge trap film 52 is made of silicon nitride, for example. A portion 52*a* of the charge trap film 52 that is aligned with each word line WL is an example of a "charge storage portion" that can store information by storing charge.

The block insulating film 53 is provided on the outer peripheral side of the charge trap film 52. The block insulating film 53 is positioned between the plurality of conductive layers 31 and the charge trap film 52. The block insulating film 53 is formed, for example, in an annular shape along the outer peripheral surface of the charge trap film 52 and extends in the Z direction along the charge trap film 52. The block insulating film 53 is an insulating film that prevents back tunneling. Back tunneling is a phenomenon in which charges return from the word line WL to the charge trap film 52. The block insulating film 53 is, for example, a stacked structure film in which a plurality of insulating films such as silicon oxide films or metal oxide films are stacked. An example of a metal oxide is aluminum oxide. The block insulating film 53 may include a high dielectric constant material (High-k material) such as silicon nitride or hafnium oxide.

With the above configuration, at the same height as each word line WL, the end portion of the word line WL adjacent to the memory pillar 40, the block insulating film 53, the charge trap film 52, the tunnel insulating film 51, and the channel layer 42 form a MANOS (Metal-Al-Nitride-Oxide-Silicon) type memory cell transistor MT. The multilayer film 41 may have a floating gate type charge storage portion (floating gate electrode) instead of the charge trap film 52 as the charge storage portion. The floating gate electrode is made of polysilicon containing impurities, for example.

Channel Layer

The channel layer 42 is provided in the multilayer film 41. The channel layer 42 is formed in an annular shape and extends in the Z direction over the entire length (total height) of the memory pillar 40. Here, a portion of the multilayer film 41 positioned at the same height as the source line SL is removed (see FIG. 5). Thereby, the lower end portion of the channel layer 42 is in contact with and connected to the source line SL. The channel layer 42 is formed of a semiconductor material such as polysilicon. The channel layer 42 may be doped with impurities. The channel layer 42 forms a channel to electrically connect the bit line BL and the source line SL when a voltage is applied to the word line WL.

Insulating Core

The insulating core 43 is provided in the channel layer 42. The insulating core 43 partially fills the inside of the channel layer 42. The insulating core 43 is made of an insulating material such as silicon oxide. The insulating core 43 extends in the Z direction over most of the memory pillar 40 except for an upper end portion of the memory pillar 40. A part of the insulating core 43 may be annularly formed along the inner peripheral surface of the channel layer 42 and has a space portion (air gap) S inside.

Cap Portion

The cap portion 44 is provided above the insulating core 43 (see FIG. 5). The cap portion 44 is a semiconductor portion made of a semiconductor material such as amorphous silicon. The cap portion 44 may be doped with impurities. The cap portion 44 is disposed in an upper end portion of the channel layer 42. The cap portion 44 forms the upper end portion of the memory pillar 40 together with the upper end portion of the channel layer 42. The contact 59 for the memory pillar is in contact with the cap portion 44 in the Z direction.

2.2.4 Dividing Portion

Next, referring back to FIG. 4, the dividing portion ST will be described. The dividing portion ST is a wall portion that divides the stacked body 30 in the Y direction. The plurality of dividing portions ST are located with a space in the Y direction. The dividing portion ST extends in the Z direction and penetrates the stacked body 30. The dividing portion ST extends along the X direction and spans the pair of stepped regions SRa and SRb with the array region AR interposed therebetween (see FIG. 7). The dividing portion ST includes, for example, an insulating portion 57 and a conductive portion 58.

The insulating portion 57 extends in the Z direction and penetrates the stacked body 30 and the insulating layer 24. The insulating portion 57 divides each of the plurality of conductive layers 31 in the stacked body 30 in the Y direction. The insulating portion 57 is made of an insulating material such as silicon oxide.

The conductive portion 58 is provided in the insulating portion 57. The conductive portion 58 extends in the Z direction and penetrates the stacked body 30 and the insulating layer 24. A lower end of the conductive portion 58 is connected to the source line SL. The conductive portion 58 is made of a conductive material such as tungsten. The conductive portion 58 is an electrical connection portion that connects the source line SL and the wiring in the memory cell array 11.

2.2.5 Upper Dividing Portion

Next, the upper dividing portion SHE will be described. The upper dividing portion SHE is a dividing portion shallower than the dividing portion ST. The plurality of upper dividing portions SHE are located with a space in the Y direction. The upper dividing portion SHE is provided at the upper end portion of the stacked body 30 and extends halfway through the stacked body 30 in the Z direction. The upper dividing portion SHE penetrates the conductive layer 31 functioning as the drain-side select gate line SGD. On the other hand, the upper dividing portion SHE does not reach the conductive layer 31 functioning as the word line WL. The upper dividing portion SHE is a wall portion that divides the conductive layer 31 functioning as the drain-side select gate line SGD in the Y direction. The upper dividing portion SHE is made of an insulating material such as silicon oxide. The upper dividing portion SHE extends along the X direction over the entire length of the array region AR (see FIG. 7).

Figure 7:
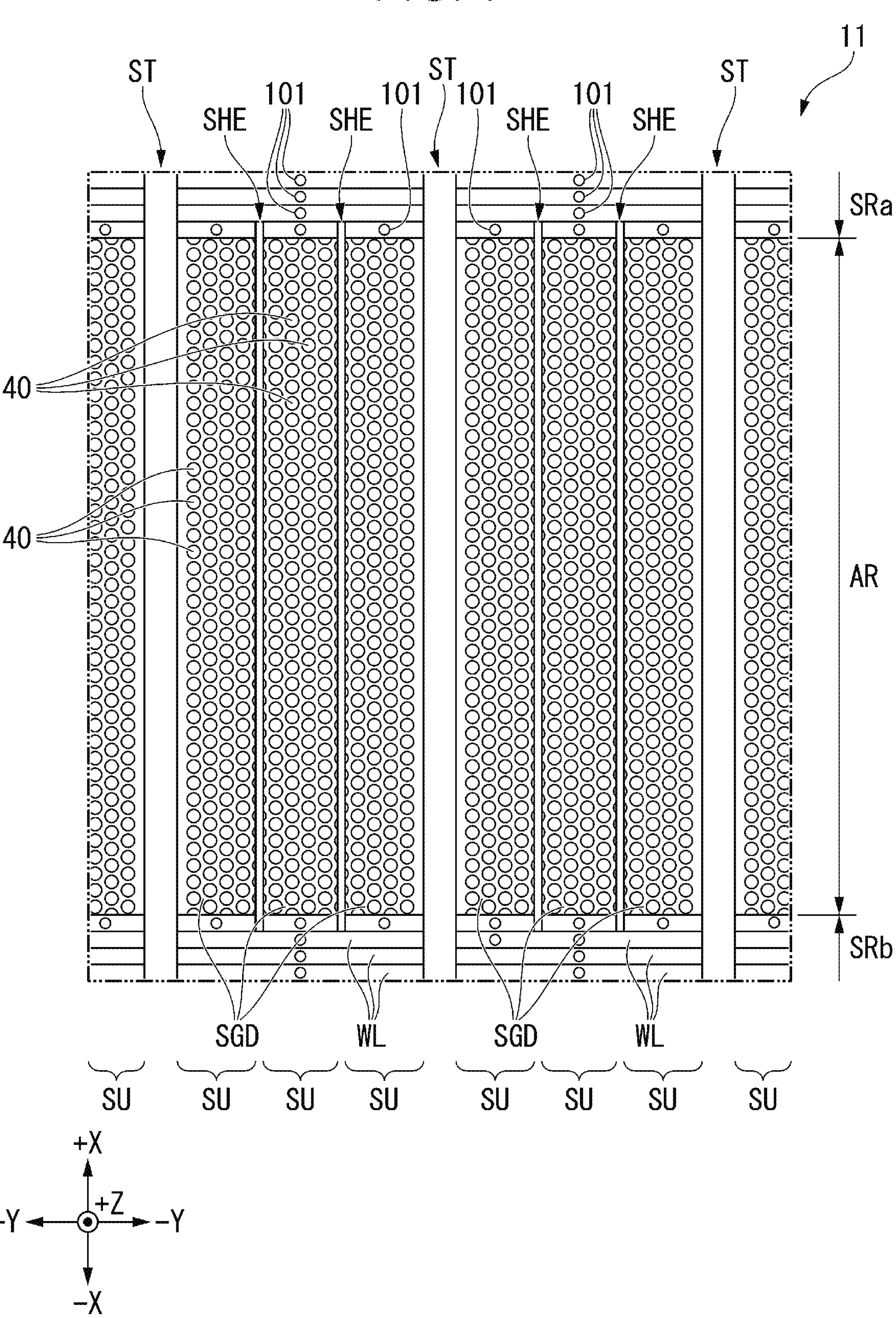
FIG. 7 is a cross-sectional view taken along line F7-F7 of the memory cell array shown in FIG. 4.

FIG. 7 is a cross-sectional view taken along line F7-F7 of the memory cell array 11 shown in FIG. 4. In the present embodiment, the conductive layer 31 corresponding to the drain-side select gate line SGD is divided in the Y direction by the dividing portion ST and the upper dividing portion SHE. As a result, the drain-side select gate lines SGD extending in the X direction are formed. Thus, the region divided by the dividing portion ST or the upper dividing portion SHE corresponds to one string unit SU.

2.2.6 Contact for Memory Pillar

Next, referring back to FIG. 3, the contact 59 for the memory pillar will be described. The contact 59 is an electrical connection portion that connects the memory pillar 40 and the bit line BL in the upper wiring structure 60. The plurality of contacts 59 are located at positions corresponding to the plurality of memory pillars 40 when viewed from above. Each contact 59 extends in the Z direction and electrically connects the bit line BL and the channel layer 42 of the memory pillar 40. The contact 59 is made of a conductive material such as tungsten.

2.2.4 Upper Wiring Structure

Next, the upper wiring structure 60 will be described. The upper wiring structure 60 is a structure body including a plurality of wirings disposed on the +Z direction side with respect to the stacked body 30. The upper wiring structure 60 includes, for example, a plurality of bit lines BL and a plurality of wirings 61.

Each bit line BL is disposed on the corresponding contact 59. The bit line BL is connected to the channel layer 42 of the memory pillar 40 via the contact 59. Thus, any memory cell transistor MT can be selected from among a plurality of memory cell transistors MT located three-dimensionally by combining word lines WL and bit lines BL.

Each wiring 61 is disposed on a contact 101 for a conductive layer, which will be described later. The wiring 61 is connected to the conductive layer 31 (word line WL, drain-side select gate line SGD, or source-side select gate line SGS) via the contact 101. Accordingly, by applying a voltage to the wiring 61, a voltage can be applied to the desired conductive layer 31.

3. Configuration Related to Stepped Region

Next, the configuration related to the stepped regions SRa and SRb will be described. The stepped region SRa disposed on the +X direction side of the array region AR and the stepped region SRb disposed on the −X direction side of the array region AR have the same configuration as each other except that the stepped regions SRa and SRb are symmetrical with respect to the X direction. Therefore, here, the configuration related to one stepped region SRa will be taken and described.

3.1 Stepped Structure by Conductive Layers

Figure 8:
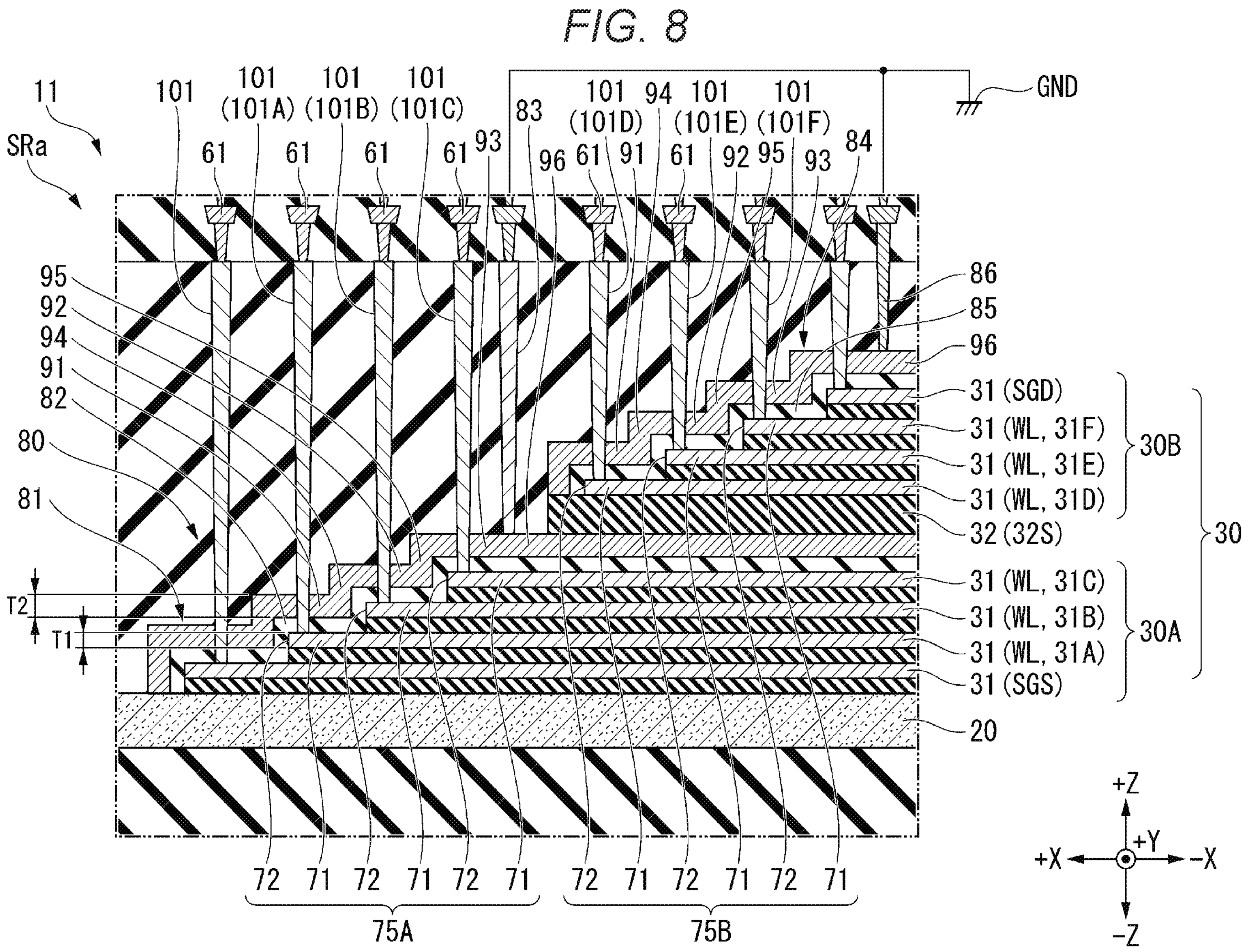
FIG. 8 is a cross-sectional view showing a region surrounded by line F8 of the memory cell array shown in FIG. 3.

FIG. 8 is a cross-sectional view showing a region surrounded by line F8 of the memory cell array 11 shown in FIG. 3. In the stepped region SRa, the plurality of conductive layers 31 (for example, the plurality of word lines WL) have different lengths in the X direction. In the plurality of conductive layers 31 in the stepped region SRa, the length in the +X direction becomes shorter as the conductive layer 31 is positioned closer to the +Z direction side. Thus, each conductive layer 31 has a terrace portion 71 that does not overlap with other conductive layers 31 positioned above the conductive layer 31, and a raised portion 72 that is the end on the +X direction side.

In the present embodiment, a lower stepped portion 75A having a plurality of steps is formed by the terrace portions 71 and the raised portions 72 of the plurality of conductive layers 31 in the lower stacked body 30A. Similarly, an upper stepped portion 75B having a plurality of steps is formed by the terrace portions 71 and the raised portions 72 of the plurality of conductive layers 31 in the upper stacked body 30B. In the following description, when the lower stepped portion 75A and the upper stepped portion 75B are not distinguished, the lower stepped portion 75A and the upper stepped portion 75B are simply referred to as "stepped portion 75".

More specifically, the plurality of conductive layers 31 include, for example, first to sixth conductive layers 31A to 31F.

The first to third conductive layers 31A to 31C are in the lower stacked body 30A. The first conductive layer 31A is the lowest among the first to third conductive layers 31A to 31C. The second conductive layer 31B is disposed above the first conductive layer 31A and has a shorter length in the X direction than the first conductive layer 31A. The third conductive layer 31C is disposed above the second conductive layer 31B and has a shorter length in the X direction than the second conductive layer 31B.

Due to the configuration described above, the first conductive layer 31A has the terrace portion 71 that does not overlap with the second conductive layer 31B in the Z direction. The second conductive layer 31B has the terrace portion 71 that does not overlap with the third conductive layer 31C in the Z direction. The third conductive layer 31C has the terrace portion 71 that does not overlap with the upper conductive layer 31 in the Z direction. The first conductive layer 31A is an example of a "first gate electrode layer". The second conductive layer 31B is an example of a "second gate electrode layer". The third conductive layer 31C is an example of a "third gate electrode layer".

Meanwhile, the fourth to sixth conductive layers 31D to 31F are in the upper stacked body 30B. The fourth conductive layer 31D is the lowest among the fourth to sixth conductive layers 31D to 31F. The fifth conductive layer 31E is disposed above the fourth conductive layer 31D and has a shorter length in the X direction than the fourth conductive layer 31D. The sixth conductive layer 31F is disposed above the fifth conductive layer 31E and has a shorter length in the X direction than the fifth conductive layer 31E.

With the configuration described above, the fourth conductive layer 31D has the terrace portion 71 that does not overlap with the fifth conductive layer 31E in the Z direction. The fifth conductive layer 31E has the terrace portion 71 that does not overlap with the sixth conductive layer 31F in the Z direction. The sixth conductive layer 31F has the terrace portion 71 that does not overlap with the upper conductive layer 31 in the Z direction. The fourth conductive layer 31D is an example of a "fourth gate electrode layer". The fifth conductive layer 31E is an example of a "fifth gate electrode layer".

In at least one embodiment, the memory cell array 11 includes a plurality of supports HR (see FIG. 3). The support HR is a columnar body extending in the Z direction in the stacked body 30. The support HR is provided at the stepped portion 75. The support HR is a support portion that supports the plurality of insulating layers 32 at the stepped portion 75 in a state where a sacrifice layer 121 is removed in a replacement process to be described later.

3.2 Stopper Structure

Next, the stopper structure 80 provided in the stepped regions SRa and SRb will be described. In at least one embodiment, the memory cell array 11 includes the stopper structure 80. The stopper structure 80 is a structure for preventing deep excavation of a hole H2 (see parts (d) to (f) in FIG. 12) in which the contact 101 is formed in the manufacturing process of the semiconductor memory device 1. The stopper structure 80 includes, for example, a first metal layer 81, a first insulating layer 82, a lower contact 83, a second metal layer 84, a second insulating layer 85, and an upper contact 86.

3.2.1 First Metal Layer

The first metal layer 81 is a stopper layer that prevents deep excavation of the hole H2 (see the parts (d) to (f) in FIG. 12) in which the contact 101 is formed in the lower stacked body 30A. The first metal layer 81 is disposed at least on the +Z direction side with respect to the terrace portion 71 of each of the plurality of conductive layers 31 (for example, the first to third conductive layers 31A to 31C) in the lower stacked body 30A. In at least one embodiment, the first metal layer 81 is formed in a stepped shape along the lower stepped portion 75A. In this case, the first metal layer 81 is positioned on the +Z direction side and the +X direction side with respect to the terrace portion 71 of each of the plurality of conductive layers 31 (for example, the first to third conductive layers 31A to 31C) in the lower stacked body 30A.

For example, the first metal layer 81 includes a first portion 91, a second portion 92, a third portion 93, a first step portion 94, a second step portion 95, and a plate portion 96.

The first portion 91 is positioned above the terrace portion 71 of the first conductive layer 31A. The first portion 91 is layered along the X and Y directions. At least a part of the first portion 91 is positioned at the same height as the second conductive layer 31B. That is, at least the part of the first portion 91 is aligned with the second conductive layer 31B in the X direction.

The second portion 92 is positioned above the terrace portion 71 of the second conductive layer 31B. The second portion 92 is layered along the X and Y directions. The second portion 92 is disposed at a different position (different height) from the first portion 91 in the Z direction. At least a part of the second portion 92 is positioned at the same height as the third conductive layer 31C. That is, at least the part of the second portion 92 is aligned with the third conductive layer 31C in the X direction.

The third portion 93 is positioned above the terrace portion 71 of the third conductive layer 31C. The third portion 93 is layered along the X and Y directions. The third portion 93 is disposed at a different position (different height) from the second portion 92 in the Z direction. At least a part of the third portion 93 is positioned at the same height as one conductive layer 31 positioned above the third conductive layer 31C. That is, at least the part of the third portion 93 is aligned with one conductive layer 31 positioned above the third conductive layer 31C in the X direction.

The first step portion 94 is positioned between the first portion 91 and the second portion 92. The first step portion 94 extends in the Z direction along the raised portion 72 of the second conductive layer 31B. The first step portion 94 connects the first portion 91 and the second portion 92.

The second step portion 95 is positioned between the second portion 92 and the third portion 93. The second step portion 95 extends in the Z direction along the raised portion 72 of the third conductive layer 31C. The second step portion 95 connects the second portion 92 and the third portion 93.

The plate portion 96 is positioned at the uppermost portion of the first metal layer 81. The plate portion 96 is positioned above the uppermost conductive layer 31 in the lower stacked body 30A. The plate portion 96 is positioned, for example, between the lower stacked body 30A and the insulating layer 32S. The plate portion 96 extends in the X and Y directions. The plate portion 96 extends, for example, to a position between the stepped region SRa and the array region AR. That is, the first metal layer 81 is provided in the stepped region SRa, but not provided in the array region AR.

Figure 9:
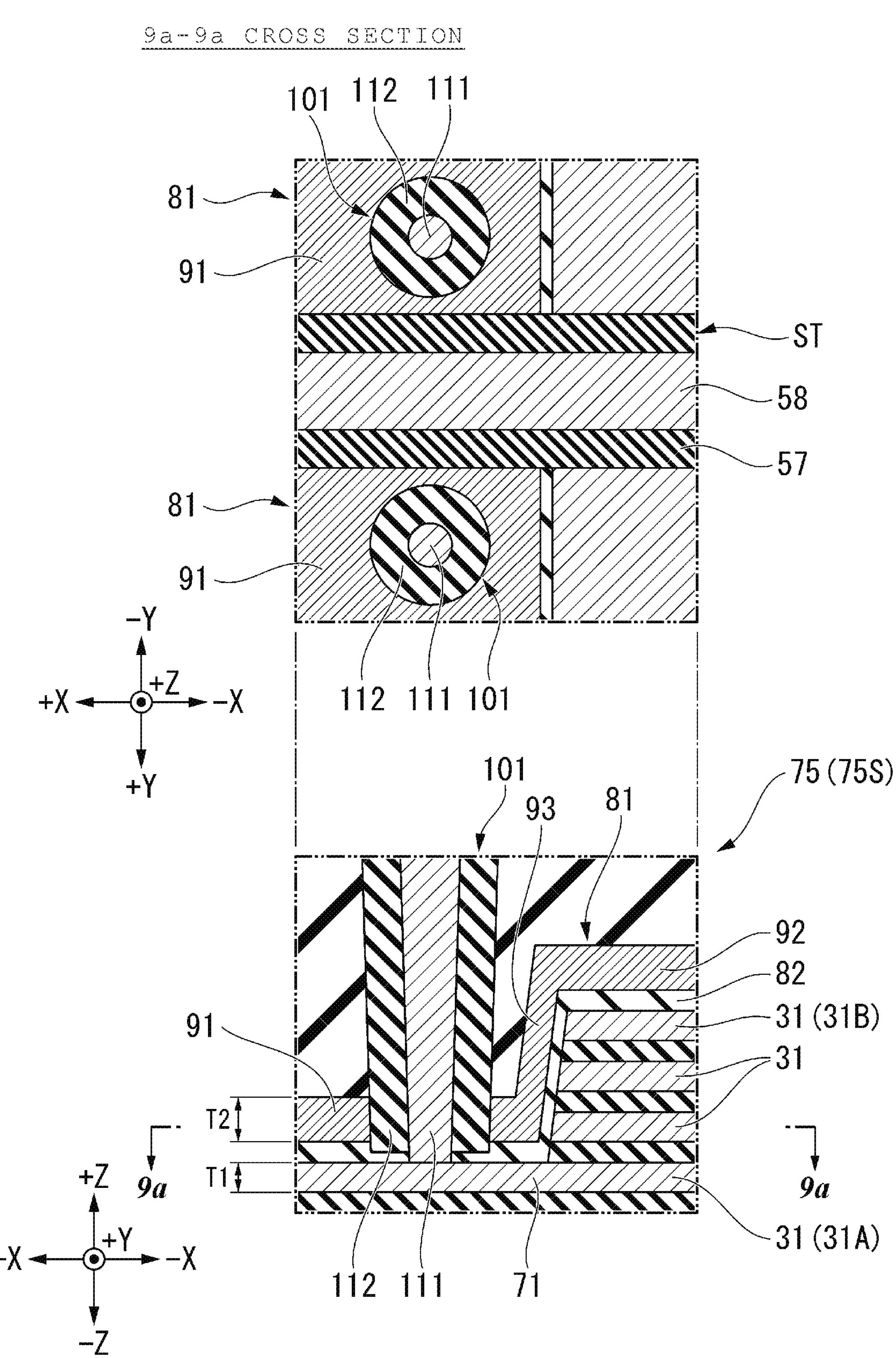
FIG. 9 is a cross-sectional view illustrating a configuration of a contact of the first embodiment.

In at least one embodiment, each portion of the first metal layer 81 (the first portion 91, the second portion 92, the third portion 93, the first step portion 94, the second step portion 95, and the plate portion 96) is in contact with the dividing portion ST in the Y direction (see FIG. 9). For example, each portion of the first metal layer 81 is in contact with the insulating portion 57 of the dividing portion ST in the Y direction.

In at least one embodiment, the first metal layer 81 and the plurality of conductive layers 31 are made of the same material (for example, a metal material such as tungsten).

In at least one embodiment, in a region overlapping with the terrace portion 71 of the first conductive layer 31A in the Z direction, a thickness T2 of the first metal layer 81 in the Z direction is greater than a thickness T1 of the first conductive layer 31A in the Z direction. For example, in the region overlapping with the terrace portion 71 of the first conductive layer 31A in the Z direction, the thickness T2 of the first metal layer 81 in the Z direction is 1.5 times or more than the thickness T1 of the first conductive layer 31A in the Z direction. From another point of view, in the region overlapping with the terrace portion 71 of the first conductive layer 31A in the Z direction, the thickness T2 of the first metal layer 81 in the Z direction is two times or less than the thickness T1 of the first conductive layer 31A in the Z direction.

In at least one embodiment, the first metal layer 81 is connected to ground GND via the lower contact 83, which will be described later. The first metal layer 81 functions as a shield layer positioned between the plurality of conductive layers 31 in the lower stacked body 30A and the plurality of bit lines BL and wirings 61 in the upper wiring structure 60.

3.2.2 First Insulating Layer

The first insulating layer 82 is an insulating portion to insulate the first metal layer 81 from the plurality of conductive layers 31 in the lower stacked body 30A. For example, the first insulating layer 82 is provided between the lower stepped portion 75A and the first metal layer 81. The first insulating layer 82 is formed in a stepped shape along the lower stepped portion 75A. For example, the first insulating layers 82 are provided between the terrace portion 71 of the first conductive layer 31A and the first portion 91 of the first metal layer 81, between the terrace portion 71 of the second conductive layer 31B and the second portion 92 of the first metal layer 81, between the terrace portion 71 of the third conductive layer 31C and the third portion 93 of the first metal layer 81, between the raised portion 72 of the second conductive layer 31B and the first step portion 94 of the first metal layer 81, and between the raised portion 72 of the third conductive layer 31C and the second step portion 95 of the first metal layer 81. The first insulating layer 82 is made of an insulating material such as silicon oxide.

3.2.3 Lower Contact

The lower contact 83 is an electrical connection portion that connects the first metal layer 81 and the ground GND. The lower contact 83 is positioned, for example, above the uppermost conductive layer 31 in the lower stacked body 30A. For example, the lower contact 83 is positioned above the plate portion 96 of the first metal layer 81. The lower contact 83 is a conductive plug extending in the Z direction. A lower end of the lower contact 83 is connected to the plate portion 96 of the first metal layer 81.

3.2.4 Second Metal Layer

The second metal layer 84 is a stopper layer that prevents deep excavation of the hole H2 in which the contact 101 is formed in the upper stacked body 30B. The second metal layer 84 is disposed at least on the +Z direction side with respect to the terrace portion 71 of each of the plurality of conductive layers 31 (for example, the fourth to sixth conductive layers 31D to 31F) in the upper stacked body 30B. In the present embodiment, the second metal layer 84 is formed in a stepped shape along the upper stepped portion 75B. In this case, the second metal layer 84 is disposed on the +Z direction side and the +X direction side with respect to the terrace portion 71 of each of the plurality of conductive layers 31 (for example, the fourth to sixth conductive layers 31D to 31F) in the upper stacked body 30B.

In at least one embodiment, the first metal layer 81 and the second metal layer 84 are separated from each other. That is, the second metal layer 84 is not connected to the first metal layer 81.

3.2.5 Second Insulating Layer

The second insulating layer 85 is an insulating layer for insulating the second metal layer 84 from the plurality of conductive layers 31 in the upper stacked body 30B. For example, the second insulating layer 85 is provided between the upper stepped portion 75B and the second metal layer 84. The second insulating layer 85 is formed in a stepped shape along the upper stepped portion 75B.

3.2.6 Upper Contact

The upper contact 86 is an electrical connection portion that connects the second metal layer 84 and the ground GND. For example, the upper contact 86 is positioned above the uppermost conductive layer 31 (for example, the conductive layer 31 functioning as the drain-side select gate line SGD) in the upper stacked body 30B. For example, the upper contact 86 is positioned above the plate portion 96 of the second metal layer 84. The upper contact 86 is a conductive plug extending in the Z direction. A lower end of the upper contact 86 is connected to the plate portion 96 of the second metal layer 84.

Other descriptions of the second metal layer 84, the second insulating layer 85, and the upper contact 86 only need to be read, in the above descriptions of the first metal layer 81, the first insulating layer 82, and the lower contact 83, as follows: the "first metal layer 81" as the "second metal layer 84", the "first insulating layer 82" as the "second insulating layer 85", the "lower contact 83" as the "upper contact 86", the "lower stacked body 30A" to the "upper stacked body 30B", the "lower stepped portion 75A" as the "upper stepped portion 75B", the "first conductive layer 31A" as the "fourth conductive layer 31D", the "second conductive layer 31B" as the "fifth conductive layer 31E", and the "third conductive layer 31C" as the "sixth conductive layer 31F".

3.3 Contact for Conductive Layer

Next, the plurality of contacts 101 for the conductive layer will be described. The contact 101 is an electrical connection portion that connects the conductive layer 31 and the wiring 61 in the upper wiring structure 60. The plurality of contacts 101 are disposed at positions corresponding to the terrace portions 71 of the plurality of conductive layers 31 when viewed from above. The plurality of contacts 101 extend in the Z direction and have different lengths in the Z direction. The contact 101 is an example of a "columnar body".

In at least one embodiment, each contact 101 is disposed above the terrace portion 71 of the conductive layer 31 which is the connection destination. Each contact 101 penetrates the first metal layer 81 or the second metal layer 84 and is connected to the terrace portion 71 of the conductive layer 31. For example, the plurality of contacts 101 includes first to sixth contacts 101A to 101F. The first contact 101A is an example of a "first columnar body". The second contact 101B is an example of a "second columnar body". The fourth contact 101D is an example of a "third columnar body".

The first contact 101A penetrates the first portion 91 of the first metal layer 81 in the Z direction and is connected to the terrace portion 71 of the first conductive layer 31A. A lower end of the first contact 101A is positioned above the conductive layer 31 positioned below the first conductive layer 31A. The second contact 101B penetrates the second portion 92 of the first metal layer 81 in the Z direction and is connected to the terrace portion 71 of the second conductive layer 31B. A lower end of the second contact 101B is positioned above the first conductive layer 31A. The third contact 101C penetrates the third portion 93 of the first metal layer 81 in the Z direction and is connected to the terrace portion 71 of the third conductive layer 31C. A lower end of the third contact 101C is positioned above the second conductive layer 31B.

Similarly, the fourth contact 101D penetrates the first portion 91 of the second metal layer 84 in the Z direction and is connected to the terrace portion 71 of the fourth conductive layer 31D. A lower end of the fourth contact 101D is positioned above the conductive layer 31 positioned below the fourth conductive layer 31D. The fifth contact 101E penetrates the second portion 92 of the second metal layer 84 in the Z direction and is connected to the terrace portion 71 of the fifth conductive layer 31E. A lower end of the fifth contact 101E is positioned above the fourth conductive layer 31D. The sixth contact 101F penetrates the third portion 93 of the second metal layer 84 in the Z direction and is connected to the terrace portion 71 of the sixth conductive layer 31F. A lower end of the sixth contact 101F is positioned above the fifth conductive layer 31E.

FIG. 9 is a cross-sectional view illustrating a configuration of the contact 101. Here, the contact 101 connected to the lower stepped portion 75A will be described as an example. Each contact 101 includes a conductive portion 111 and an insulating portion 112.

The conductive portion 111 extends over the entire length of the contact 101 in the Z direction. The conductive portion 111 penetrates the first metal layer 81 in the Z direction and is connected to the terrace portion 71 of the conductive layer 31. The conductive portion 111 connects the terrace portion 71 of the conductive layer 31 and the wiring 61 in the upper wiring structure 60. The conductive portion 111 has, for example, a cylindrical shape or an inverted truncated cone shape.

The insulating portion 112 is an insulating portion to ensure electrical insulation between the conductive portion 111 and the first metal layer 81. The insulating portion 112 is disposed at least between the first metal layer 81 and the conductive portion 111. In at least one embodiment, the insulating portion 112 is formed in an annular shape along the outer peripheral surface of the conductive portion 111 and extends over the entire length of the contact 101 in the Z direction.

The configuration of the contact 101 connected to the upper stepped portion 75B is the same as the configuration of the contact 101 connected to the lower stepped portion 75A. For the description of the contact 101 connected to the upper stepped portion 75B, the "first metal layer 81" in the above description of the contact 101 connected to the lower stepped portion 75A only needs to be replaced with the "second metal layer 84".

3.4 Example of Stepped Portion

Figure 10:
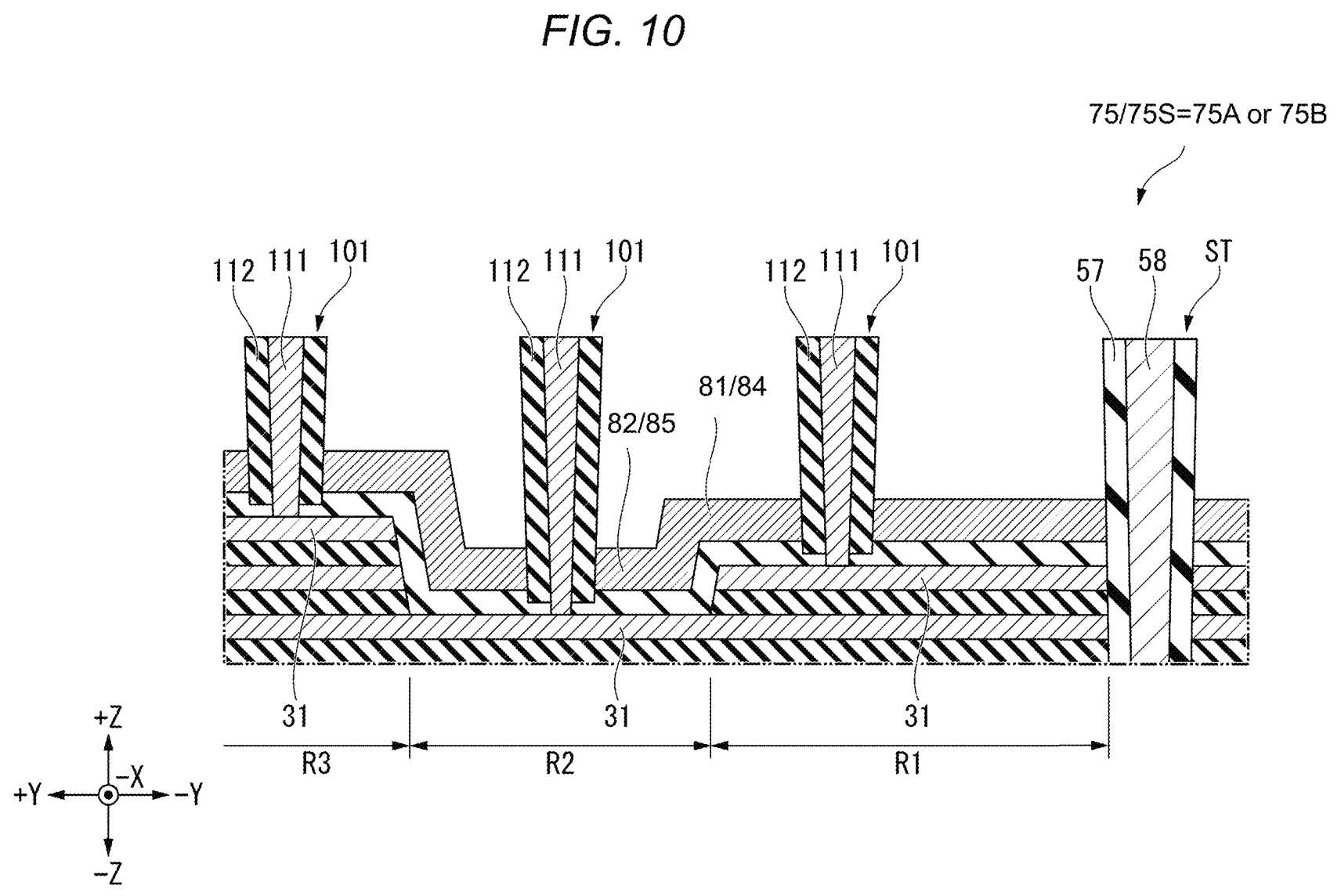

FIG. 10 is a cross-sectional view illustrating a multistage stepped portion 75S that is an example of the stepped portion 75. In the above description, for convenience of explanation, the case where the lengths of all the conductive layers 31 differ one by one in the X direction is described. However, the memory cell array 11 may have the multistage stepped portion 75S as the stepped portion 75. The multistage stepped portion 75S is a stepped portion having a plurality of steps in the Y direction.

For example, the multistage stepped portion 75S includes a first region R1, a second region R2, and a third region R3 in the Y direction. The first region R1 is the closest to the dividing portion ST among the first to third regions R1 to R3. Meanwhile, the third region R3 is the farthest from the dividing portion ST among the first to third regions R1 to R3. The second region R2 is disposed between the first region R1 and the third region R3.

Among the first to third regions R1 to R3, the second region R2 is the lowest. The first region R1 is higher than the second region R2 by including the conductive layer 31 one layer above in addition to the conductive layer 31 of the second region R2. The third region R3 is higher than the first region R1 by including the conductive layer 31 one layer above in addition to the conductive layer 31 of the first region R1.

In at least one embodiment, the first metal layer 81 and the first insulating layer 82 are continuously provided over the first to third regions R1 to R3. That is, the first metal layer 81 and the first insulating layer 82 are provided along the steps between the first to third regions R1 to R3. Similarly, the second metal layer 84 and the second insulating layer 85 are continuously provided over the first to third regions R1 to R3. That is, the second metal layer 84 and the second insulating layer 85 are provided along the steps between the first to third regions R1 to R3.

The multistage stepped portion 75S also has a plurality of steps in the X direction (see parts (a) to (c) in FIG. 11). For example, each of the first to third regions R1 to R3 has steps corresponding to the height of three conductive layers 31 in the X direction. The first metal layer 81 and the first insulating layer 82 are also continuously provided over each step in the X direction. Similarly, the second metal layer 84 and the second insulating layer 85 are continuously provided over each step in the X direction as well.

The contact 101 is provided in each of the first to third regions R1 to R3. According to such a configuration, the dimension of the stepped regions SRa and SRb in the X direction can be reduced compared to the case where the lengths of all the conductive layers 31 differ one by one in the X direction.

4. Manufacturing Method

The part (a) in FIG. 11 to the part (f) in FIG. 12 are cross-sectional views illustrating a method for manufacturing the semiconductor memory device 1. The part (a) in FIG. 11 to the part (f) in FIG. 12 describe the configuration around one contact 101 in the lower stepped portion 75A. The part (a) in FIG. 11 to the part (f) in FIG. 12 are examples showing the case where the above-described multistage stepped portion 75S is provided.

First, as shown in the part (a) in FIG. 11, a stacked body 120 is formed from a plurality of sacrifice layers 121 and the plurality of insulating layers 32. The plurality of sacrifice layers 121 and the plurality of insulating layers 32 are alternately stacked one by one in the Z direction. The sacrifice layer 121 is a layer to be replaced with the conductive layer 31 in the replacement process described later. The sacrifice layer 121 is made of silicon nitride, for example. The sacrifice layer 121 is an example of a "first layer". The insulating layer 32 is a layer whose material is different from that of the sacrifice layer 121, and is made of silicon oxide, for example. The insulating layer 32 is an example of a "second layer".

Next, a stepped portion 125 is formed in the stacked body 120. The stepped portion 125 is formed by etching the portion to be removed of the stacked body 120 to remove the sacrifice layer 121 and the insulating layer 32 in the portion to be removed. In the stepped portion 125, at least one sacrifice layer 121A in the plurality of sacrifice layers 121 (for example, a sacrifice layer to be replaced with the first conductive layer 31A in a later process) has a different length in the X direction from that of another sacrifice layer 121B in the plurality of sacrifice layers 121 (for example, a sacrifice layer to be replaced with the second conductive layer 31B in a later process). The processes up to this point can be performed using a known method.

Next, as shown in a part (b) in FIG. 11, an insulating material (for example, silicon oxide) is supplied at least onto the stepped portion 125 to form the first insulating layer 82 on the stepped portion 75. The first insulating layer 82 is formed in a stepped shape along the stepped portion 125. The first insulating layer 82 is an example of a "third layer".

Next, as shown in the part (c) in FIG. 11, the same insulating material (for example, silicon nitride) as the plurality of sacrifice layers 121 is supplied at least onto the stepped portion 125 (that is, onto the first insulating layer 82) to form a sacrifice layer 131 on the stepped portion 125 (that is, on the first insulating layer 82). The sacrifice layer 131 is formed in a stepped shape along the stepped portion 125. The sacrifice layer 131 is a layer to be replaced with the first metal layer 81 in the replacement process described later. The sacrifice layer 131 is a layer whose material is different from that of the first insulating layer 82, and is an example of a "fourth layer".

Next, as shown in the part (d) in FIG. 12, an insulator 140 covering the stacked body 120 and the sacrifice layer 131 is provided. The insulator 140 is made of, for example, TEOS (tetraethyl orthosilicate ($Si(OC_2H_5)_4$).

Next, grooves 151 are formed in the stacked body 120 for forming the dividing portions ST. An etchant is then supplied to the grooves 151 to remove the plurality of sacrifice layers 121 and the sacrifice layer 131. Then, the spaces from which the plurality of sacrifice layers 121 and the sacrifice layer 131 are removed are filled back with a metal material such as tungsten, so that the plurality of sacrifice layers 121 and the sacrifice layer 131 are replaced with the plurality of conductive layers 31 and the first metal layer 81. Thereby, the lower stepped portion 75A is formed from the stepped portion 125.

Next, as shown in a part (e) in FIG. 12, the hole H2 for providing the contact 101 is processed. The processing of the hole H2 includes a first process (see the part (e) in FIG. 12) of processing the hole H2 in the insulator 140 using the first metal layer 81 as a stopper layer, and a second process (see the part (f) in FIG. 12) of deeply excavating the hole H2 after the first process to connect the hole H2 to the first conductive layer 31A. That is, in the first process, the hole H2 is processed in the insulator 140, and the processing of the hole H2 is stopped when a detection device (not shown) detects that the hole H2 reaches the first metal layer 81. In the first process, the hole H2 is not limited to being stopped at the upper surface of the first metal layer 81. The hole H2 may be stopped in a state in which the hole H2 is excavated halfway through the first metal layer 81, or the hole H2 may be stopped in a state in which the hole H2 penetrates the first metal layer 81.

Next, after the first process is completed, an insulating material is supplied to the inside of the hole H2. As a result, a bottomed annular insulating portion 161 is formed along an inner peripheral surface and a bottom portion of the hole H2.

Next, as shown in the part (f) in FIG. 12, the second process is performed in which etching conditions and the like are changed from the first process to excavate the hole H2. That is, the portion of the insulating portion 161 formed at the bottom portion of the hole H2 is removed by etching. Thereby, an annular insulating portion 112 is formed. After that, the hole H2 is made to reach the first conductive layer 31A by excavating the hole H2 as the second process. Next, a conductive material is supplied to the inside of the hole H2 and the annular insulating portion 112. Thereby, the conductive portion 111 is formed in the insulating portion 112. Thus, the contact 101 is formed.

The method for manufacturing the first metal layer 81 and the contact 101 in the lower stepped portion 75A is described above with reference to the part (a) in FIG. 11 to the part (f) in FIG. 12. The same applies to the method for manufacturing the second metal layer 84 and the contact 101 in the upper stepped portion 75B.

Next, the flow of the method for manufacturing the semiconductor memory device 1 will be described from a different point of view. FIGS. 13 and 20 are cross-sectional views illustrating the method for manufacturing the semiconductor memory device 1. As shown in FIG. 13, the plurality of sacrifice layers 121 and the plurality of insulating layers 32 are alternately stacked one by one in the Z direction to form a lower stacked body 120A corresponding to the lower stacked body 30A. Next, a lower stepped portion 125A, which will become the lower stepped portion 75A in a later process, is formed in the lower stacked body 120A.

Next, the first insulating layer 82 is provided on the lower stepped portion 125A by supplying an insulating material at least onto the lower stepped portion 125A. Next, by supplying the same insulating material (for example, silicon nitride) as the plurality of sacrifice layers 121 onto the first insulating layer 82, the sacrifice layer 131 (hereinafter referred to as "first sacrifice layer 131A") to be replaced with the first metal layer 81 in a later process is formed.

Next, as shown in FIG. 14, an insulator 140A covers the lower stacked body 120A and the first sacrifice layer 131A. Next, a hole H1A in which the lower pillar 40A is provided in a later process and a hole H3A in which the lower portion of the support HR is provided in a later process are formed in the lower stacked body 120A. These holes H1A and H3A are once filled with a sacrificial body 155.

Next, as shown in FIG. 15, the plurality of sacrifice layers 121 and the plurality of insulating layers 32 are alternately stacked one by one in the Z direction to form an upper stacked body 120B corresponding to the upper stacked body 30B. Next, an upper stepped portion 125B, which will become the upper stepped portion 75B in a later process, is formed in the upper stacked body 120B.

Next, the second insulating layer 85 is provided on the upper stepped portion 125B by supplying an insulating material at least onto the upper stepped portion 125B. Next, by supplying the same insulating material (for example, silicon nitride) as the plurality of sacrifice layers 121 onto the second insulating layer 85, the sacrifice layer 131 (hereinafter referred to as "second sacrifice layer 131B") to be replaced with the second metal layer 84 in a later process is formed. An insulator 140B then covers the upper stacked body 120B and the second sacrifice layer 131B. The insulator 140B is combined with the previously provided insulator 140A to form the insulator 140.

Next, as shown in FIG. 16, the upper stacked body 120B is formed with a hole H1B in which the upper pillar 40B is provided and a hole H3B in which the upper portion of the support HR is provided. The hole H1B is then connected to the hole H1A. The hole H3B is connected to the hole H3A. Next, the sacrificial body 155 provided in the holes H1A and H3A is removed. Next, the memory pillar 40 is formed in the holes H1A and H1B, and the support HR is formed in the holes H3A and H3B.

Next, as shown in FIG. 17, the plurality of sacrifice layers 121, the first sacrifice layer 131A, and the second sacrifice layer 131B are replaced with the plurality of conductive layers 31, the first metal layer 81, and the second metal layer 84, respectively, via grooves 151 (see the parts (d) to (f) in FIG. 12) for providing the dividing portions ST. Thereby, the lower stepped portion 75A is formed from the lower stepped portion 125A, and the upper stepped portion 75B is formed from the upper stepped portion 125B.

Next, as shown in FIG. 18, the hole H2 for providing the contact 101 and the hole H4 for providing the lower contact 83 are provided at the insulator 140.

Next, as shown in FIG. 19, the contact 101 is formed in the hole H2, and the lower contact 83 is formed in the hole H4. Next, as shown in FIG. 20, a contact 171 connecting the contact 101 and the wiring 61 is formed. Also, a contact 172 connecting the lower contact 83 and the ground GND is formed. The upper contact 86 is also formed. Next, bit lines BL, wirings 61, and the like are formed. Thus, the semiconductor memory device 1 is completed.

5. Advantages

In recent years, in order to further improve the mounting density of the semiconductor memory device 1, the thickness of the conductive layer 31 and the insulating layer 32 is reduced and the number of layers is increased. Here, as a first comparative example, a case where there is no stopper structure for the contact 101 is considered. In this case, it is difficult to control the depth in processing the hole H2 for the contact 101, and there is a possibility that the contact 101 may excessively pierce the conductive layer 31 or may cause a defect such as the contact 101 not coming into contact with the conductive layer 31.

Also, as a second comparative example, a case where the stopper layer for the hole H2 is formed of an insulating layer such as silicon nitride. In this case, it is necessary to provide a separating portion between the insulating layer and the dividing portion ST to separate the insulating layer and the dividing portion ST. This is to avoid short-circuiting of the contact 101 due to replacement of a part of the insulating layer (stopper layer) with the metal material together with the sacrifice layer 131 in the replacement process for the sacrifice layer 131. In the configuration of the second comparative example, a space is required between the insulating layer and the dividing portion ST, which makes it difficult to reduce the size of the semiconductor memory device 1.

Therefore, in at least one embodiment, the semiconductor memory device 1 has the first metal layer 81 disposed at least above the terrace portion 71 of the first conductive layer 31A. The first contact 101A includes the conductive portion 111 extending in the Z direction and penetrating the first metal layer 81 to be connected to the terrace portion 71 of the first conductive layer 31A, and the insulating portion 112 disposed at least between the first metal layer 81 and the conductive portion 111.

With such a configuration, the presence of the stopper layer makes it easier to control the depth in processing the hole H2 for the contact 101. Further, when the stopper layer is a metal layer, the hole H2 can be processed by utilizing the selection ratio between the metal and the insulating material as the selection ratio between the stopper layer and the insulating layer 32. This makes it easier to control the depth in processing the hole H2 for the contact 101, compared to the case where the stopper layer is an insulating layer.

Further, in the present embodiment, since the insulating portion 112 can ensure the pressure resistance between the contact 101 and the first metal layer 81, short-circuiting between the contact 101 and the first metal layer 81 can be avoided. As a result, the first metal layer 81 can be disposed adjacent to the dividing portion ST. As a result, the size of the semiconductor memory device 1 can be reduced.

In at least one embodiment, at least a part of the first metal layer 81 is aligned with the second conductive layer 31B in the X direction. According to such a configuration, the first metal layer 81 is disposed near the terrace portion 71 of the first conductive layer 31A. Therefore, it becomes easier to control the depth in processing the hole H2.

In at least one embodiment, the semiconductor memory device 1 further includes the first insulating layer 82 including a portion disposed between the first metal layer 81 and the first conductive layer 31A. With such a configuration, it is possible to ensure insulation between the first metal layer 81 and the first conductive layer 31A. Thereby, one first metal layer 81 can be provided for the plurality of conductive layers 31.

In at least one embodiment, the first metal layer 81 and the first conductive layer 31A are made of the same material. According to such a configuration, the first metal layer 81 can be formed simultaneously in the replacement process for the plurality of conductive layers 31. Thereby, it is possible to avoid the necessity of a dedicated process of manufacturing the first metal layer 81. As a result, the manufacturability of the semiconductor memory device 1 can be further improved.

In at least one embodiment, the thickness T2 of the first metal layer 81 in the Z direction is greater than the thickness T1 of the first conductive layer 31A in the Z direction in the region overlapping with the terrace portion 71 of the first conductive layer 31A in the Z direction. With such a configuration, the function of the first metal layer 81 as a stopper layer can be enhanced. Further, in at least one embodiment, the first metal layer 81 is formed in a stepped shape including the step portion 81*d*. When the thickness of the first metal layer 81 is large, the conductive material is likely to enter the inside of the step portion 81*d* in the replacement process. As a result, it becomes easier to form the first metal layer 81.

In at least one embodiment, the thickness T2 of the first metal layer 81 in the Z direction is 1.5 times or more than the thickness T1 of the first conductive layer 31A in the Z direction in the region overlapping with the terrace portion 71 of the first conductive layer 31A in the Z direction. With such a configuration, the function of the first metal layer 81 as a stopper layer can be further enhanced, and the first metal layer 81 having a step can be formed more easily.

In at least one embodiment, the thickness T2 of the first metal layer 81 in the Z direction is two times or less than the thickness T1 of the first conductive layer 31A in the Z direction in the region overlapping with the terrace portion 71 of the first conductive layer 31A in the Z direction. With such a configuration, it is possible to avoid insufficient replacement (introduction of the metal material) of the first metal layer 81 when the replacement of the conductive layer 31 is completed in the replacement process. As a result, the manufacturability of the semiconductor memory device 1 can be further improved.

In at least one embodiment, the first metal layer 81 is connected to the ground GND. With such a configuration, the first metal layer 81 functions as a shield layer, and signal noise in the memory cell array 11 can be reduced. For example, interference between signals flowing through the plurality of conductive layers 31 (for example, the plurality of word lines WL) and signals flowing through the upper wiring structure 60 can be reduced. As a result, the operating performance of the semiconductor memory device 1 can be improved.

In at least one embodiment, the first metal layer 81 includes the first portion 91 covering the terrace portion 71 of the first conductive layer 31A in the Z direction, the second portion 92 disposed at a position different from the first portion 91 in the Z direction and covering the terrace portion 71 of the second conductive layer 31B, and the step portion 94 provided between the first portion 91 and the second portion 92 to connect the first portion 91 and the second portion 92. According to such a configuration, the first metal layer 81 can be provided at a position close to each of the plurality of conductive layers 31 located in a stepped shape. This makes it easier to control the depth in processing the hole H2.

In the present embodiment, the first metal layer 81 and the second metal layer 84 are separated from each other. According to such a configuration, it becomes easy to form the first metal layer 81 and the second metal layer 84 in a configuration in which the stacked body 30 is formed by the lower stacked body 30A and the upper stacked body 30B. As a result, the manufacturability of the semiconductor memory device 1 can be further improved.

Second Embodiment

Next, a second embodiment will be described. The second embodiment differs from the first embodiment in that an insulating portion 210 of a contact 201 has a thick portion at a height corresponding to the first metal layer 81 or the second metal layer 84. Configurations other than those described below are the same as those of the first embodiment.

FIG. 21 is a cross-sectional view illustrating a configuration of the contact 201 of the present embodiment. Here, the contact 201 connected to the lower stepped portion 75A will be described as an example. The contact 201 connected to the upper stepped portion 75B also has a similar configuration.

In at least one embodiment, the memory cell array 11 has a plurality of contacts 201 instead of the plurality of contacts 101 described in the first embodiment. Each contact 201 includes a conductive portion 111 and an insulating portion 210. The conductive portion 111 is the same as the conductive portion 111 of the first embodiment.

The insulating portion 210 includes, for example, a first insulating portion 211 and the second insulating portion 212. The first insulating portion 211 is disposed at a position separated from the first metal layer 81 and the conductive portion 111. The first insulating portion 211 extends along the conductive portion 111. The second insulating portion 212 is disposed between the first metal layer 81 and the conductive portion 111. A thickness T4 of the second insulating portion 212 in the X and Y directions is larger than a thickness T3 of the first insulating portion 211 in the X and Y directions. The thickness T3 and the thickness T4 are dimensions at the boundary between the first insulating portion 211 and the second insulating portion 212, for example.

In at least one embodiment, when the thickness of the first metal layer 81 in the Z direction is T2, the thickness of the first insulating portion 211 in the X direction is T3, the thickness of the second insulating portion 212 in the X direction is T4, and the difference between the thickness T4 and the thickness T3 (T4−T3, the amount of recess processing described later) is ΔT, the following expressions (1) and (2) are satisfied.

$$T3\times 2>\Delta T>T3 \quad \text{Expression (1)}$$

$$T2<T3\times 2 \quad \text{Expression (2)}$$

When the relationships of the above expressions (1) and (2) are satisfied, voids are less likely to occur in the second insulating portion 212, and the insulation of the second insulating portion 212 can be easily ensured.

Next, a method for manufacturing the semiconductor memory device 1 according to the present embodiment will be described.

A part (a) in FIG. 22 to a part (e) in FIG. 23 are cross-sectional views showing the flow of the method for manufacturing the semiconductor memory device 1 according to the present embodiment. The process of the part (a) in FIG. 22 is the process of the part (d) in FIG. 12 described in the first embodiment.

Next, as shown in a part (b) in FIG. 22, the hole H2 for providing the contact 201 is processed. The processing of the hole H2 includes a first process of processing a hole in the insulator 140 using the first metal layer 81 as a stopper layer, and a second process of deeply excavating the hole H2 after the first process to connect the hole H2 to the first conductive layer 31A (see the parts (e) and (f) in FIG. 12). The processing of the first process is the same as the processing of the first process described in the first embodiment.

Next, as shown in a part (c) in FIG. 22, as a part of the second process, a part of the first metal layer 81 is removed by etching, and an enlarged diameter portion is formed in which the hole H2 inside the first metal layer 81 is larger than that inside the insulator 140. That is, the hole H2 includes a first portion H2*a* formed in the insulator 140 and a second portion H2*b* (enlarged diameter portion) formed in the first metal layer 81. Processing the hole H2 includes removing the part of the first metal layer 81 from the inside of the hole H2 by etching (recessing process) so that the width of the second portion H2*b* of the hole H2 in the X and Y directions is expanded compared to the first portion H2*a* of the hole H2. As the etching, mixed acid wet etching, reactive ion etching (RIE), or the like may be used.

Next, as shown in a part (d) in FIG. 23, an insulating material is supplied to the inside of the hole H2 to form an insulating portion 250 along the inner peripheral surface and the bottom portion of the hole H2. At this time, the second insulating portion 212 is formed in the second portion H2*b* (enlarged diameter portion) of the hole H2.

Next, as shown in the part (e) in FIG. 23, as a part of the second process, the hole H2 is excavated while changing the etching conditions from the first process. That is, the portion of the insulating portion 250 formed at the bottom portion of the hole H2 is removed by etching. Thereby, the annular insulating portion 210 is formed. After that, the hole H2 is made to reach the first conductive layer 31A by excavating the hole H2 as the second process. Next, a conductive material is supplied to the inside of the hole H2 and the annular insulating portion 210. Thereby, the conductive portion 111 is formed in the insulating portion 210. Thus, the contact 201 is formed. Other manufacturing processes are the same as the manufacturing processes described in the first embodiment.

According to such a configuration, it is possible to improve the manufacturability of the semiconductor memory device 1 as in the first embodiment. Further, according to at least one embodiment, the thickness of the first insulating portion 211 of the insulating portion 210 of the contact 101 can be reduced while ensuring the necessary pressure resistance. This makes it easier to locate a plurality of contacts 101 at a higher density than, for example, the first embodiment. Thereby, further miniaturization of the semiconductor memory device 1 can be achieved.

Although several embodiments are described above, the embodiments are not limited to the above examples. For example, the first metal layer 81 and the second metal layer 84 may be in a floating state instead of being connected to the ground GND. The first metal layer 81 and the second metal layer 84 may be provided by directly forming metal films by CVD (Chemical Vapor Deposition) or other methods instead of being formed by replacing the sacrifice layer.

According to at least one embodiment described above, a semiconductor memory device includes a first metal layer disposed at least on a first side with respect to a first gate electrode layer, and a first columnar body disposed on the first side with respect to the first gate electrode layer. The first gate electrode layer has a terrace portion that does not overlap with a second gate electrode layer. The first columnar body includes a conductive portion penetrating the first metal layer to be connected to the terrace portion of the first gate electrode layer, and an insulating portion disposed at least between the first metal layer and the conductive portion. According to such a configuration, manufacturability can be improved.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor memory device comprising:

a stacked body including a plurality of gate electrode layers and a plurality of insulating layers, the plurality of gate electrode layers and the plurality of insulating layers being alternately stacked one by one in a first direction, the plurality of gate electrode layers including a first gate electrode layer and a second gate electrode layer, the second gate electrode layer being disposed on a first side in the first direction with respect to the first gate electrode layer, the second gate electrode layer having a length in a second direction intersecting the first direction that is shorter than that of the first gate electrode layer, the first gate electrode layer having a terrace portion that does not overlap with the second gate electrode layer in the first direction;

a first metal layer disposed at least on the first side with respect to the terrace portion of the first gate electrode layer; and a first columnar body disposed on the first side with respect to the terrace portion of the first gate electrode layer, wherein the first columnar body including a conductive portion and an insulating portion, the conductive portion extending in the first direction, the conductive portion penetrating the first metal layer and connected to the terrace portion of the first gate electrode layer, the insulating portion disposed at least between the first metal layer and the conductive portion, wherein in a region overlapping with the terrace portion of the first gate electrode layer in the first direction, a thickness of the first metal layer in the first direction is greater than a thickness of the first gate electrode layer in the first direction.

2. The semiconductor memory device according to claim 1, wherein at least a part of the first metal layer is aligned with the second gate electrode layer in the second direction.

3. The semiconductor memory device according to claim 1, further comprising:

a first insulating layer including a portion disposed between the first metal layer and the first gate electrode layer.

4. The semiconductor memory device according to claim 1, wherein the first metal layer and the first gate electrode layer are made of a same material.

5. The semiconductor memory device according to claim 1, wherein in a region overlapping with the terrace portion of the first gate electrode layer in the first direction, a thickness of the first metal layer in the first direction is 1.5 times or more than a thickness of the first gate electrode layer in the first direction.

6. The semiconductor memory device according to claim 1, wherein the first metal layer is grounded.

7. The semiconductor memory device according to claim 1, wherein the stacked body further includes a third gate electrode layer disposed on the first side with respect to the second gate electrode layer, the third gate electrode layer having a length in the second direction shorter than that of the second gate electrode layer, the second gate electrode layer having a terrace portion that does not overlap with the third gate electrode layer in the first direction, and the first metal layer includes a first portion, a second portion, and a step portion, the first portion disposed on the first side with respect to the terrace portion of the first gate electrode layer, the second portion disposed at a position different from the first portion in the first direction and disposed on the first side with respect to the terrace portion of the second gate electrode layer, and the step portion disposed between the first portion and the second portion and connecting the first portion and the second portion.

8. The semiconductor memory device according to claim 7, further comprising:

a second columnar body disposed on the first side with respect to the terrace portion of the second gate electrode layer, wherein the first columnar body penetrates the first portion of the first metal layer and is connected to the terrace portion of the first gate electrode layer, and the second columnar body penetrates the second portion of the first metal layer and is connected to the terrace portion of the second gate electrode layer.

9. The semiconductor memory device according to claim 1, further comprising:

a second metal layer; and a third columnar body, wherein the stacked body includes a first stacked body and a second stacked body, the first stacked body including at least two gate electrode layers in the plurality of gate electrode layers, and the second stacked body disposed on the first side with respect to the first stacked body and including at least two gate electrode layers in the plurality of gate electrode layers, wherein the at least two gate electrode layers of the first stacked body include the first gate electrode layer and the second gate electrode layer, and the at least two gate electrode layers of the second stacked body include a fourth gate electrode layer and a fifth gate electrode layer, the fifth gate electrode layer disposed on the first side with respect to the fourth gate electrode layer, and the fifth gate electrode layer having a length in the second direction shorter than that of the fourth gate electrode layer, wherein the fourth gate electrode layer has a terrace portion that does not overlap with the fifth gate electrode layer in the first direction, and wherein the second metal layer is disposed at least on the first side with respect to the terrace portion of the fourth gate electrode layer, and the third columnar body (i) is disposed on the first side with respect to the terrace portion of the fourth gate electrode layer, (ii) extends in the first direction, (iii) penetrates the second metal layer, and (iv) is connected to the terrace portion of the fourth gate electrode layer.

10. The semiconductor memory device according to claim 9, wherein the first metal layer and the second metal layer are separated from each other.

11. The semiconductor memory device according to claim 1, wherein the insulating portion includes a first insulating portion and a second insulating portion, the first insulating portion disposed at a position separated from the first metal layer and the conductive portion and extending along the conductive portion, the second insulating portion disposed between the first metal layer and the conductive portion, and a thickness of the second insulating portion in the second direction is greater than a thickness of the first insulating portion in the second direction.

12. The semiconductor memory device according to claim 1, wherein the semiconductor memory device includes a non-volatile semiconductor memory.

13. The semiconductor memory device according to claim 1, wherein the plurality of gate electrode layers include tungsten.

14. The semiconductor memory device according to claim 1, wherein the plurality of insulating layers include silicon oxide.

15. The semiconductor memory device according to claim 1, wherein the conductive portion includes tungsten.

16. The semiconductor memory device according to claim 1, wherein the insulating portion includes silicon oxide.

* * * * *